(12) United States Patent
Yamazaki et al.

(10) Patent No.: US 9,754,980 B2
(45) Date of Patent: Sep. 5, 2017

(54) PHOTOELECTRIC CONVERSION ELEMENT AND IMAGING DEVICE

(71) Applicant: Semiconductor Energy Laboratory Co., Ltd., Atsugi-shi, Kanagawa-ken (JP)

(72) Inventors: Shunpei Yamazaki, Setagaya (JP); Yusuke Nonaka, Atsugi (JP); Riho Kataishi, Isehara (JP); Hiroshi Ohki, Atsugi (JP); Yuichi Sato, Isehara (JP); Daisuke Matsubayashi, Ebina (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/193,677

(22) Filed: Jun. 27, 2016

(65) Prior Publication Data

US 2017/0005126 A1    Jan. 5, 2017

(30) Foreign Application Priority Data

Jun. 30, 2015  (JP) .................................. 2015-131426

(51) Int. Cl.
*H01L 27/146*   (2006.01)
*H01L 31/0224*  (2006.01)
(Continued)

(52) U.S. Cl.
CPC .. *H01L 27/14607* (2013.01); *H01L 27/14612* (2013.01); *H01L 27/14636* (2013.01);
(Continued)

(58) Field of Classification Search
CPC ......... H01L 27/14607; H01L 27/14636; H01L 31/0224; H01L 31/022475; H01L 31/109;
(Continued)

(56) References Cited

U.S. PATENT DOCUMENTS

| 4,860,076 A | 8/1989 | Tabei et al. |
| 5,198,673 A | 3/1993 | Rougeot et al. |

(Continued)

FOREIGN PATENT DOCUMENTS

JP    2014-017440    1/2014

OTHER PUBLICATIONS

Imura.S et al., "Low-voltage-operation avalanche photodiode based on n-gallium oxide/p-crystalline selenium heterojunction", Appl. Phys. Lett. (Applied Physics Letters), Jun. 16, 2014, vol. 104, No. 24, pp. 242101-1-242101-4.

(Continued)

*Primary Examiner* — Kyoung Lee
(74) *Attorney, Agent, or Firm* — Robinson Intellectual Property Law Office; Eric J. Robinson

(57) ABSTRACT

An imaging device with excellent imaging performance is provided. An imaging device that easily performs imaging under a low illuminance condition is provided. A low power consumption imaging device is provided. An imaging device with small variations in characteristics between its pixels is provided. A highly integrated imaging device is provided. A photoelectric conversion element includes a first electrode, and a first layer, a second layer, and a third layer. The first layer is provided between the first electrode and the third layer. The second layer is provided between the first layer and the third layer. The first layer contains selenium. The second layer contains a metal oxide. The third layer contains a metal oxide and also contains at least one of a rare gas atom, phosphorus, and boron. The selenium may be crystalline selenium. The second layer may be a layer of an In—Ga—Zn oxide including c-axis-aligned crystals.

22 Claims, 26 Drawing Sheets

(51) Int. Cl.
*H01L 31/0272* (2006.01)
*H01L 31/0296* (2006.01)
*H01L 31/109* (2006.01)

(52) U.S. Cl.
CPC .. *H01L 27/14647* (2013.01); *H01L 27/14665* (2013.01); *H01L 27/14694* (2013.01); *H01L 27/14696* (2013.01); *H01L 31/0224* (2013.01); *H01L 31/0272* (2013.01); *H01L 31/0296* (2013.01); *H01L 31/022475* (2013.01); *H01L 31/109* (2013.01); *H01L 27/14621* (2013.01); *H01L 27/14627* (2013.01)

(58) Field of Classification Search
CPC ......... H01L 27/14621; H01L 27/14612; H01L 31/0272; H01L 31/0296; H01L 27/14627
See application file for complete search history.

(56) References Cited

U.S. PATENT DOCUMENTS

| | | | |
|---|---|---|---|
| 7,046,282 B1 | 5/2006 | Zhang et al. | |
| 8,378,391 B2 | 2/2013 | Koyama et al. | |
| 8,424,764 B2 | 4/2013 | Tanaka et al. | |
| 8,916,869 B2 | 12/2014 | Koyama et al. | |
| 9,236,408 B2 | 1/2016 | Yamazaki | |
| 9,331,112 B2 | 5/2016 | Koyama et al. | |
| 2009/0224162 A1 | 9/2009 | Inuiya et al. | |
| 2010/0276003 A1* | 11/2010 | Kawano | B82Y 30/00 |
| | | | 136/261 |
| 2010/0307558 A1 | 12/2010 | Yamazaki et al. | |
| 2013/0016035 A1 | 1/2013 | Ikeda | |
| 2013/0222584 A1 | 8/2013 | Aoki et al. | |
| 2014/0131728 A1* | 5/2014 | Park | H01L 31/0322 |
| | | | 257/76 |
| 2016/0336363 A1 | 11/2016 | Dairiki et al. | |

OTHER PUBLICATIONS

Ryohei Funatsu et al., "Development of 133Mpixel 60fps CMOS Image Sensor using 32-Column Shared High-Speed SAR ADCs," ITE Technical Report, vol. 39, No. 16, Mar. 27, 2015, pp. 53-56.
Ryohei Funatsu et al., "133Mpixel 60fps CMOS Image Sensor with 32-Column Shared High-Speed Column-Parallel SAR ADCs," ISSCC 2015 (Digest of Technical Papers. IEEE International Solid-State Circuits Conference), Feb. 23, 2015, pp. 6-8.

* cited by examiner

FIG. 14A1
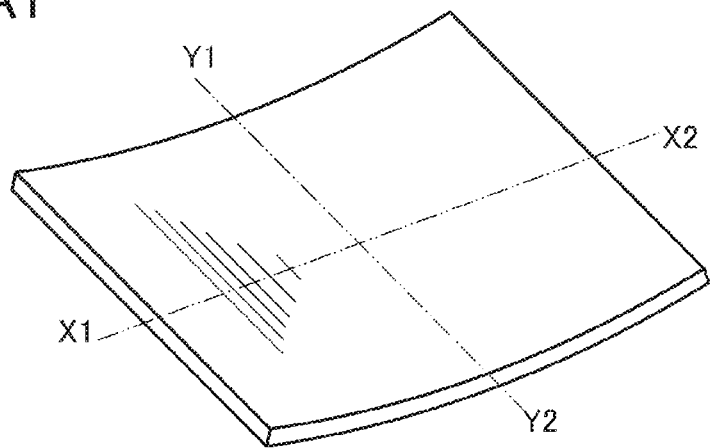
FIG. 14A2
FIG. 14A3
FIG. 14B1
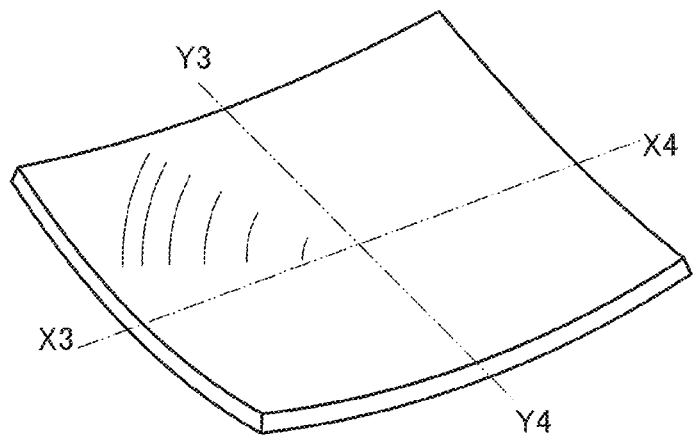
FIG. 14B2
FIG. 14B3

FIG. 18A
FIG. 18B
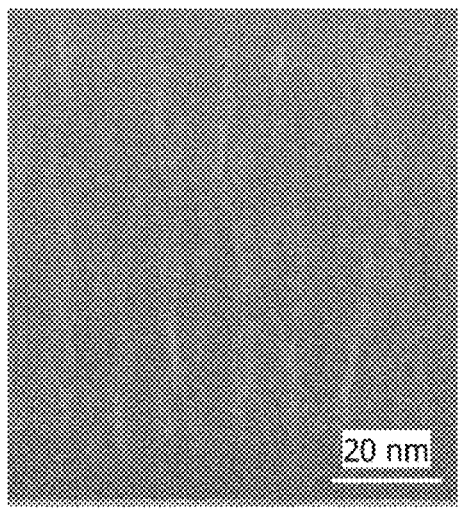
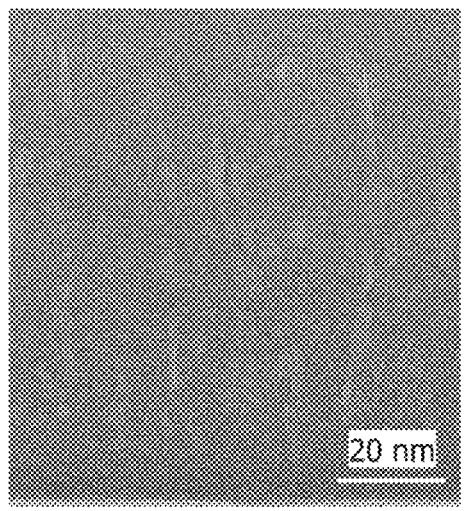

PHOTOELECTRIC CONVERSION ELEMENT AND IMAGING DEVICE

BACKGROUND OF THE INVENTION

1. Field of the Invention

One embodiment of the present invention relates to a photoelectric conversion element and an imaging device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

In recent years, consideration is being given to so-called 4K or 8K broadcasting with higher resolution (a larger number of the pixels) for showing an image and a moving image than the resolution of so-called full high definition, which is for the HD television broadcasting, using pixels of 1920×1080 (also referred to as "2K resolution," "2K1K," "2K," and the like). In particular, 8K broadcasting is expected to show images with a sense of reality, a three-dimensional effect, or an immersion effect that have not been able to be experienced by the conventional images; thus, it is highly expected that a revolutionary image experience will be given to the viewers. Note that there are many challenges to be solved such as technology and cost for achieving 4K/8K broadcasting. For example, an imaging device capable of shooting 8K images, a cable which transmits 8K video signals, a tuner included in a display device which receives 8K video signals, a display device capable of displaying 8K images, and the like are needed; however, they are all being developed.

Various devices as described above for the 2K resolution have already been achieved. However, with regard to the resolution of so-called ultra full high definition using pixels arranged in 3840×2160 or in 4096×2160 (also referred to as "4K resolution," "4K2K," "4K," and the like), 4K television broadcasting has not already been provided on a full scale, whereas the display devices began to be sold. Furthermore, with regard to the resolution of so-called super high definition using pixels arranged in 7680×4320 or in 8192×4320 (also referred to as "8K resolution," "8K4K," "8K," and the like), technology development, in any of producing, transmitting, and displaying of the video signals, for reaching the practical use level is awaited. Once 8K television broadcasting is provided, there is an additional possibility of taking 16K and 32K resolution into consideration.

In such a situation, the development of a CMOS sensor having 133,000,000 pixels for a high resolution camera capable of producing 8K images was reported (see Non-Patent Document 1). In order to fabricate such a high resolution sensor, a highly integrated array of pixels is required. High integration of pixels needs reduction in area per pixel.

In the case where the area of a pixel is reduced, the light-receiving area of a photoelectric conversion element included in the pixel also needs to be reduced. When the light-receiving area of the photoelectric conversion element is reduced, it might be difficult to perform imaging under a low illuminance condition because of the decrease in sensitivity to light.

In order to solve such a problem, a photoelectric conversion element utilizing avalanche charge multiplication can be effectively used. However, such a photoelectric conversion element has a relatively large dark current, which might cause deterioration in imaging quality. As a countermeasure, an image sensor in which a dark current can be reduced has been disclosed (see Patent Document 1).

REFERENCE

Patent Document

[Patent Document 1] Japanese Published Patent Application No. 2014-17440

Non-Patent Document

[Non-Patent Document 1] Technical Report of The Institute of Image Information and Television Engineers (ITE Technical Report), Vol. 39, No. 16, pp. 53-56, given on Mar. 27, 2015.

Patent Document 1 discloses a photoelectric conversion element in which a hole injection blocking layer formed using gallium oxide is stacked over a photoelectric conversion layer as one of the components. A photoelectric conversion element including a chalcopyrite semiconductor for a photoelectric conversion layer has a large dark current at the time of electric field application. One of the factors in the dark current is thought to be insufficient suppression of charge injection into the chalcopyrite semiconductor from an electrode. Then, a hole injection blocking layer formed using gallium oxide is stacked over a photoelectric conversion layer, for example, whereby charge injection can be suppressed and the dark current can be reduced.

The hole injection blocking layer is effective in suppressing a dark current; however, a hole injection blocking layer whose material has a low electrical conductivity or a thick hole injection blocking layer degrades the performance of the imaging device. Accordingly, a thin hole injection blocking layer is preferable, and furthermore, a highly conductive hole injection blocking layer is preferable. In addition, the hole injection blocking layer is required to have a structure which can achieve both a function of blocking hole injection into an electrode and a high electrical conductivity. If both of the two properties are achieved, high sensitivity to external light and low noise intensity can be achieved. Therefore, an imaging device with a high signal-to-noise (S/N) ratio can be provided.

Note that the above problems arise not necessarily only when an imaging device includes pixels of high resolution such as 8K, but also when an imaging device includes pixels of 4K resolution or lower. There are other objects which will be apparent, in due course, from the description of the specification, the drawings, the claims, and the like.

SUMMARY OF THE INVENTION

In view of the above, an object of one embodiment of the present invention is to provide an imaging device with excellent imaging performance. Another object is to provide an imaging device that easily performs imaging under a low illuminance condition. Another object is to provide a low power consumption imaging device. Another object is to provide an imaging device that is suitable for high-speed operation. Another object is to provide a high resolution imaging device. Another object is to provide an imaging device with little noise. Another object is to provide an imaging device with a high S/N ratio. Another object is to provide an imaging device with small variations in characteristics between its pixels. Another object is to provide a highly integrated imaging device. Another object is to provide an imaging device which can be used in a wide temperature range. Another object is to provide an imaging device with a high aperture ratio. Another object is to provide an imaging device with high reliability. Another object is to provide a novel imaging device or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a photoelectric conversion element which includes a first electrode, a first layer, a second layer, and a third layer. The first layer is provided between the first electrode and the third layer. The second layer is provided between the first layer and the third layer. The first layer contains selenium. The second layer contains a metal oxide. The third layer contains a metal oxide and has an electrical conductivity of $2.0 \times 10^1$ S/cm to $2.6 \times 10^2$ S/cm inclusive.

Another embodiment of the present invention is a photoelectric conversion element which includes a first electrode, a first layer, a second layer, and a third layer. The first layer is provided between the first electrode and the third layer. The second layer is provided between the first layer and the third layer. The first layer contains selenium. The second layer contains a metal oxide. The third layer contains a metal oxide and also contains at least one of a rare gas atom, phosphorus, and boron.

Note that, in one embodiment of the present invention, the second layer and the third layer may contain In, Ga, Zn, and O as the metal oxide. Furthermore, the second layer and the third layer which contain In, Ga, Zn, and O may include c-axis-aligned crystals. In addition, the selenium may be crystalline selenium. The first layer may function as a photoelectric conversion layer, and the second layer may function as a hole injection blocking layer. The photoelectric conversion element may also include a fourth layer between the first layer and the first electrode, and the fourth layer may function as an electron injection blocking layer. The fourth layer may contain nickel oxide or antimony sulfide. The third layer may have an electrical conductivity. The photoelectric conversion element may include a second electrode in contact with the third layer, and the second electrode may contain indium tin oxide (ITO).

Another embodiment of the present invention is a photoelectric conversion element which includes a first electrode, a first layer over the first electrode, a second layer over the first layer, and a third layer over the second layer. The first layer contains crystalline selenium. The first layer functions as a photoelectric conversion layer. The second layer contains an In—Ga—Zn oxide having c-axis alignment. The third layer contains an In—Ga—Zn oxide having c-axis alignment. The third layer also contains xenon and/or phosphorus. The second layer functions as a hole injection blocking layer. The third layer functions as an electrode.

Another embodiment of the present invention is an imaging device which includes the photoelectric conversion element of one embodiment of the present invention and a driver transistor electrically connected to the photoelectric conversion element. The imaging device may also include a microlens array or a diffraction grating and a color filter and the photoelectric conversion element is capable of receiving the light passing through the microlens array or the diffraction grating and the color filter. The driver transistor may contain an oxide semiconductor. In the imaging device, the number of photoelectric conversion elements may be larger than or equal to the number which enables production of video signals with 8K resolution.

One embodiment of the present invention can provide an imaging device with excellent imaging performance. An imaging device that easily performs imaging under a low illuminance condition can be provided. A low power consumption imaging device can be provided. An imaging device that is suitable for high-speed operation can be provided. A high resolution imaging device can be provided. An imaging device with little noise can be provided. An imaging device with a high S/N ratio can be provided. An imaging device with small variations in characteristics between its pixels can be provided. A highly integrated imaging device can be provided. An imaging device which can be used in a wide temperature range can be provided. An imaging device with a high aperture ratio can be provided. An imaging device with high reliability can be provided. A novel imaging device or the like can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 14A1, 14A2, 14A3, 14B1, 14B2, and 14B3 illustrate a bent imaging device;

FIGS. 18A and 18B show cross-sectional TEM images of an oxide having an a-like structure;

DETAILED DESCRIPTION OF THE INVENTION

Figure 1A:
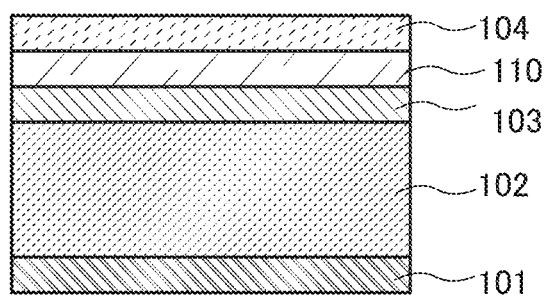
FIGS. 1A and 1B are cross-sectional views each illustrating a structure of a photoelectric conversion element.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

(Embodiment 1)

In this embodiment, a photoelectric conversion element 100 of one embodiment of the present invention will be described with reference to drawings.

FIG. 1A schematically illustrates a cross-sectional structure of the photoelectric conversion element 100 of one embodiment of the present invention. The photoelectric conversion element 100 includes a first electrode 101, a photoelectric conversion layer 102 over the first electrode 101, a hole injection blocking layer 103 over the photoelectric conversion layer 102, an oxide layer 110 over the hole injection blocking layer 103, and a second electrode 104 over the oxide layer 110.

The photoelectric conversion element 100 may be formed over a substrate or over a driver transistor which is formed in a substrate or formed over a substrate.

Figure 1B:
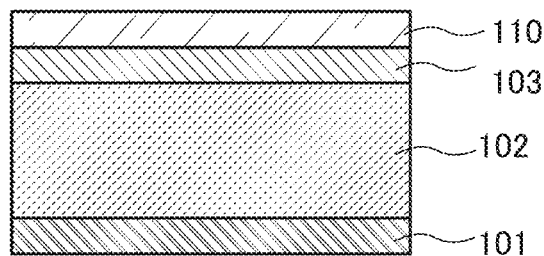

FIG. 1B schematically illustrates a cross-sectional structure of the photoelectric conversion element 100 of one embodiment of the present invention. The photoelectric conversion element 100 includes the first electrode 101, the photoelectric conversion layer 102 over the first electrode 101, the hole injection blocking layer 103 over the photoelectric conversion layer 102, and the oxide layer 110 over the hole injection blocking layer 103.

<First Electrode 101>

The first electrode 101 can be formed using gold, titanium nitride, molybdenum, tungsten, or the like, for example. Alternatively, aluminum, titanium, or a stack of titanium, aluminum, and titanium that are layered in that order can be used. The first electrode 101 can be formed by a sputtering method or a plasma CVD method.

The first electrode 101 illustrated in FIG. 1A preferably has high planarity in order to prevent a short circuit with the second electrode 104 caused by, for example, poor coverage with the photoelectric conversion layer 102.

An example of a conductive film having high planarity is an indium tin oxide film containing silicon oxide at 1 wt % to 20 wt %. The high planarity of an indium tin oxide film containing silicon oxide has been confirmed by the measurement with an atomic force microscope. A region of 2 μm×2 μm in an indium tin oxide film which has been subjected to heat treatment at 350° C. for 1 hour and a region of 2 μm×2 μm in an indium tin oxide film containing silicon oxide at 5 wt % which has been subjected to the same heat treatment were observed with an atomic force microscope; the peak-to-valley height (P-V) of the former was 23.3 nm, and that of the latter was 7.9 nm.

Since the indium tin oxide film is crystallized at a relatively low temperature even when it is amorphous at the time of its deposition, surface roughness due to the growth of crystal grains is easily caused. In contrast, when analyzed by an X-ray diffraction, the indium tin oxide film containing silicon oxide does not exhibits crystallinity even in the case where the film is subjected to heat treatment at a temperature higher than 400° C. In other words, the indium tin oxide film containing silicon oxide keeps its amorphous state even after heat treatment at a relatively high temperature. Therefore, the surface roughness of the indium tin oxide film containing silicon oxide is less likely to occur.

<Photoelectric Conversion Layer 102>

Next, the photoelectric conversion layer 102 will be described. A selenium-based material can be used for the photoelectric conversion layer 102. The photoelectric conversion element 100 including a selenium-based material has high internal quantum efficiency with respect to visible light. In such a photoelectric conversion element, carriers generated by incident light are multiplied due to the effect of charge multiplication by an avalanche phenomenon; thus, the photoelectric conversion efficiency can be improved.

Selenium can be used for the photoelectric conversion layer 102. Examples of the selenium used for the photoelectric conversion layer 102 are single-crystal selenium, polycrystalline selenium, microcrystalline selenium, and amorphous selenium. Among them, single-crystal selenium, polycrystalline selenium, and microcrystalline selenium are classified as crystalline selenium. Furthermore, a mixed selenium layer including crystalline selenium and amorphous selenium may be used. A crystalline selenium layer can be obtained by, for example, depositing an amorphous selenium layer and then performing heat treatment. Note that when the crystal grain size of the selenium included in a crystalline selenium layer used for the photoelectric conversion layer 102 is smaller than a pixel pitch, variations in characteristics between pixels can be reduced. Moreover, a crystalline selenium layer has higher spectral sensitivity to and a higher absorption coefficient for visible light than an amorphous selenium layer. Note that an amorphous selenium layer can also be used.

Furthermore, the photoelectric conversion layer 102 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize an avalanche phenomenon like the photoelectric conversion element including selenium alone. CIS and CIGS are p-type semiconductors and may be formed in contact with an n-type semiconductor such as cadmium sulfide or zinc sulfide to form a junction. A relatively high voltage (e.g., 10 V or higher) is required to be applied to the photoelectric conversion element in order to cause the avalanche phenomenon.

<Hole Injection Blocking Layer 103>

Next, the hole injection blocking layer 103 of one embodiment of the present invention will be described. The hole injection blocking layer 103 is a layer which suppresses hole injection into the photoelectric conversion layer 102 from the second electrode 104.

The conventional problem is that the photoelectric conversion element in which the above selenium-based material is used for the photoelectric conversion layer has a low S/N ratio because of its large dark current at the time of electric field application. One of causes of the dark current is that charge injection into the photoelectric conversion layer from the electrode was not able to be suppressed. Then, a structure was proposed in which a hole injection blocking layer formed using gallium oxide is provided between the photoelectric conversion layer and the electrode so that charge injection into the photoelectric conversion layer is suppressed.

Here, a tunnel current flowing through the hole injection blocking layer 103 needs to be prevented so that the hole injection blocking layer 103 is efficiently utilized; therefore, the layer needs to be greater than or equal to a certain thickness. The thickness is preferably set to be greater than or equal to 5 nm and less than or equal to 1 μm, and further preferably greater than or equal to 10 nm and less than or equal to 500 nm, for example.

Therefore, the hole injection blocking layer 103 is formed using a material with which the film thickness can be controlled more easily than with gallium oxide in one embodiment of the present invention. A material with which the hole injection blocking layer 103 can be formed in the following manner is used: first, the material for the hole injection blocking layer 103 is deposited thicker than a predetermined thickness, and then at least one of a rare gas, phosphorus, and boron is added to the top surface of the film and its vicinity. A portion to which at least one of the above elements is not added is used as the hole injection blocking layer 103.

Specifically, in one embodiment of the present invention, an oxide material is used for the hole injection blocking layer 103. As the oxide material used for the hole injection blocking layer 103, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that, for example, an "In—Ga—Zn oxide" means an oxide containing In, Ga, and Zn as its main components here, and may contain another metal element in addition to In, Ga, and Zn. In this specification, a film containing the In—Ga—Zn oxide is also referred to as an IGZO film.

As an oxide used for the hole injection blocking layer 103, an In—Ga—Zn oxide is effectively used in particular. The In—Ga—Zn oxide is likely to form a film having a c-axis-aligned crystalline (CAAC) structure or a microcrystalline oxide film. The In—Ga—Zn oxide is preferably used for the hole injection blocking layer 103 because it becomes a film having a crystal and is well suited for the photoelectric conversion layer 102, which has a crystal. Note that the In—Ga—Zn oxide contains at least In, Ga, Zn, and O. Note that, as a material that provides a CAAC structure of the In—Ga—Zn oxide, a material containing Al, Sn, Y, Hf, or Zr instead of Ga can be effectively used.

A film having a CAAC structure has specifically high crystallinity as described below. The photoelectric conversion layer 102 is preferably a crystalline selenium layer, for example, because a film having a CAAC structure which serves as the hole injection blocking layer 103 is likely to form and to adhere better to the photoelectric conversion layer 102 at the interface due to the common crystallinity of the both layers.

The composition of an In-M-Zn oxide is described here. The element M is aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like.

Figure 26:
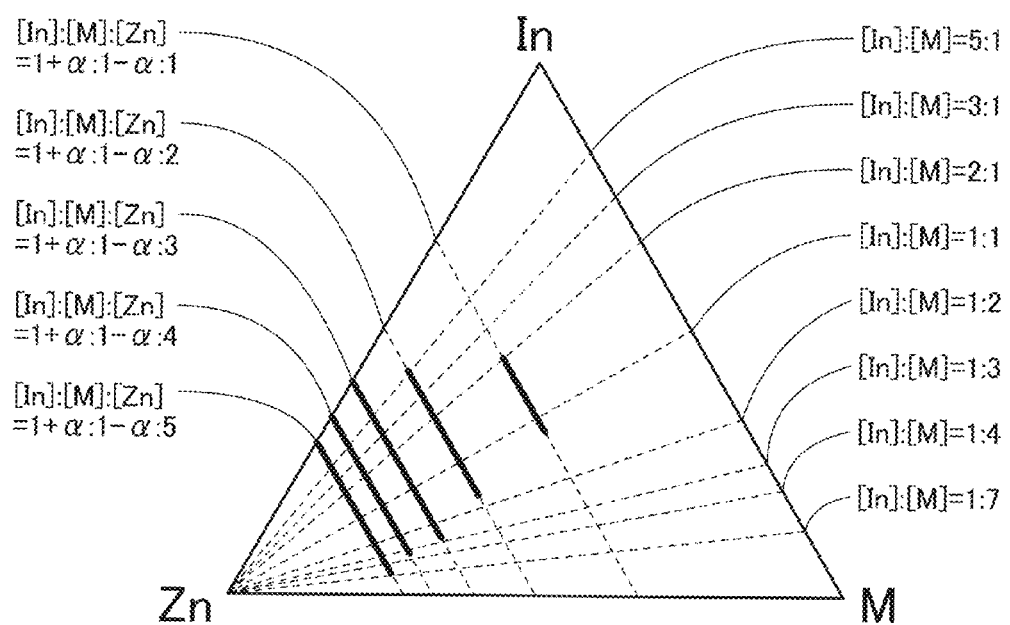
FIG. 26 is a triangular diagram showing composition of an In-M-Zn oxide.

FIG. 26 is a triangular diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)m$ (m is a natural number). Since In and M can be interchanged, the crystal can also be represented by $In_{1+\alpha}M_{1-\alpha}O_3(ZnO)_m$. This composition is represented by any of the dashed lines denoted as $[In]:[M]:[Zn]=1+\alpha:1-\alpha:1$, $[In]:[M]:[Zn]=1+\alpha:1-\alpha:2$, $[In]:[M]:[Zn]=1+\alpha:1-\alpha:3$, $[In]:[M]:[Zn]=1+\alpha:1-\alpha:4$, and $[In]:[M]:[Zn]=1+\alpha:1-\alpha:5$. Note that the bold lines on the dashed lines represent, for example, the compositions that each allow oxides (raw materials) to be a solid solution when the oxides are mixed and subjected to baking at 1350° C.

Thus, when an oxide has a composition close to the above composition that allows the oxide to be a solid solution, the crystallinity can be increased. When an In-M-Zn oxide is deposited by a sputtering method, the composition of a target is different from the composition of the deposited film in some cases. For example, using an In-M-Zn oxide in which an atomic ratio is 1:1:1, 1:1:1.2, 3:1:2, 4:2:4.1, 1:3:2, 1:3:4, or 1:4:5 as a target results in a film having an atomic ratio of 1:1:0.7 (approximately 1:1:0.5 to 1:1:0.9), 1:1:0.9 (approximately 1:1:0.8 to 1:1:1.1), 3:1:1.5 (approximately 3:1:1 to 3:1:1.8), 4:2:3 (approximately 4:2:2.6 to 4:2:3.6), 1:3:1.5 (approximately 1:3:1 to 1:3:1.8), 1:3:3 (approximately 1:3:2.5 to 1:3:3.5), or 1:4:4 (approximately 1:4:3.4 to 1:4:4.4). Thus, in order to obtain a film with a desired composition, a composition of a target may be selected in consideration of a change in the composition.

Note that the In—Ga—Zn oxide which can be used for the hole injection blocking layer 103 can have a variety of compositions. For example, an In—Ga—Zn oxide which is formed with the use of an In—Ga—Zn oxide whose atomic ratio of In to Ga and Zn is 1:3:2, 1:3:3, 1:3:4, 1:3:6, 1:4:5, 1:6:4, 4:2:3, 5:1:7, 5:1:6, or 1:9:6 as a sputtering target material can be used. An In—Ga—Zn oxide which is formed with the use of an In—Ga—Zn oxide whose atomic ratio of In to Ga and Zn is 1:1:1, 2:1:3, 5:5:6, or 3:1:2 as a sputtering target material can be used for the hole injection blocking layer 103.

An oxide film used for the hole injection blocking layer 103 typically can be formed by sputtering or plasma-enhanced CVD.

A facing-target-type sputtering apparatus can also be used for deposition of the oxide. Deposition with the facing-target-type sputtering apparatus is referred to as vapor deposition SP (VDSP) in this specification.

Note that a forming method and physical properties of the oxide will be detailed in the following embodiment.

<Oxide Layer 110>

Next, the oxide layer 110 will be described. The oxide layer 110 is a conductive layer. The oxide layer 110 can be formed in such a manner that a layer whose material is an In—Ga—Zn oxide is formed over the hole injection blocking layer 103 and then at least one of a rare gas, phosphorus, and boron is added thereto to give an electrical conductivity, that is, in the same manner as that of the hole injection blocking layer 103, for example. As examples of the rare gas, He, Ne, Ar, Kr, and Xe can be given here. The oxide layer 110 and the hole injection blocking layer 103 may be formed at the same time in the following manner: a layer is formed with the use of an In—Ga—Zn oxide used for the hole injection blocking layer 103 in advance over the photoelectric conversion layer 102, and then, at least one of a rare gas, phosphorus, and boron is added thereto from the top side of the layer to a predetermined depth. A portion which a predetermined amount of the rare gas, phosphorus, and/or boron reach and becomes conductive is assumed to be the oxide layer 110, and a portion which a predetermined amount of the rare gas, phosphorus, and/or boron does/do not reach is assumed to be the hole injection blocking layer 103. When the hole injection blocking layer 103 and the oxide layer 110 are formed in the above manner, the border between the layers is not clear in some cases.

Furthermore, when the hole injection blocking layer 103 and the oxide layer 110 are formed at the same time in such a manner that a layer including an In—Ga—Zn oxide having a CAAC structure is formed over the photoelectric conversion layer 102, and then at least one of a rare gas, phosphorus, and boron is added thereto, the CAAC structure of the hole injection blocking layer 103 is maintained. This is preferable because selenium included in the photoelectric conversion layer 102 and the In—Ga—Zn oxide having a CAAC structure included in the hole injection blocking layer 103 are close to each other in crystallinity (have similar lattice constants), and high adhesion between them can be kept.

When the hole injection blocking layer 103 and the oxide layer 110 are formed at the same time in such a manner that a layer including an In—Ga—Zn oxide having a CAAC structure is formed over the photoelectric conversion layer 102, and then at least one of a rare gas, phosphorus, and boron is added thereto, it is not necessarily preferable that the added atoms pass through the layer including the In—Ga—Zn oxide. It is difficult for a thin layer including the In—Ga—Zn oxide to stop the added atoms at an intended depth. However, it is preferable to use atoms with relatively high atomic weight, such as Xe, because the atoms are likely to be located at a relatively shallow region and thus the depth can be easily controlled.

Meanwhile, in the case where at least one of a rare gas, phosphorus, and boron is added deeply and part of them reaches the photoelectric conversion layer 102, the addition complicates the structure of the surface of the photoelectric conversion layer 102 in contact with the layer including the In—Ga—Zn oxide and the surface becomes complicated in shape in some cases. In such a case, the complicated shape of the surface of the photoelectric conversion layer 102 improves the adhesion with the layer in some cases. The layer can have a CAAC structure in some cases by improving crystallinity of the In—Ga—Zn oxide afterward. In addition, the crystallinity of selenium used for the photoelectric conversion layer 102 can be improved in some cases. When the layer including the In—Ga—Zn oxide and the photoelectric conversion layer 102 are improved in crystallinity, it is possible that the adhesion between the layers becomes weak and the layers are separated. However, the possibility of separation can be reduced in the light-emitting element of one embodiment of the present invention because the above complicated shape can improve the adhesion. Furthermore, the photoelectric conversion element having the structure in FIG. 1A can be formed, for example, in such a manner that selenium used for the photoelectric conversion layer 102 is crystallized in advance, and a portion, in the layer including the In—Ga—Zn oxide, which is near the photoelectric conversion layer 102 is crystallized using the crystallinity of the photoelectric conversion layer 102. The portion is used as the hole injection blocking layer 103 and the other portion of the layer including the In—Ga—Zn oxide is used as the oxide layer 110.

The oxide layer 110 is sometimes capable of serving partly as the second electrode 104, described later depending on its electrical conductivity or thickness. Thus, in the imaging device of one embodiment of the present invention, the thickness of the second electrode 104 can be reduced in some cases as compared with that in the imaging device without the oxide layer 110 or the second electrode 104 can be omitted in some cases. FIG. 1B shows a cross-sectional schematic structure of the photoelectric conversion element 100 in which the second electrode 104 is not provided. If being conductive, the oxide layer 110 can also be used as a wiring for electrically connecting elements in the imaging device.

In one embodiment of the present invention, the oxide layer 110 is formed to have an electrical conductivity higher than that of the hole injection blocking layer 103 as one object in such a manner that at least one of a rare gas, phosphorus, and boron is added to the In—Ga—Zn oxide. When the photoelectric conversion element 100 is configured to sense light which reaches the photoelectric conversion layer 102 through the second electrode 104 and the hole injection blocking layer 103, the light transmits the oxide layer 110, so that the oxide layer 110 preferably has high light transmittance. In the case where the oxide layer 110 has low light transmittance, highly attenuated light reaches the photoelectric conversion layer 102, whereby the signal intensity is reduced and the S/N ratio of the imaging device decreases.

For example, when the hole injection blocking layer 103 is formed with the use of gallium oxide together with the relatively highly conductive oxide layer 110, oxygen vacancies in the gallium oxide are increased by reduction of partial pressure of oxygen in the deposition gas at the time of forming the oxide layer 110. It is known that resistivity of gallium oxide is reduced due to carriers generated by the oxygen vacancies. However, as the amount of oxygen in gallium oxide is reduced, its light transmittance is decreased. Thus, in the case where gallium oxide is used for the highly conductive oxide layer 110, attenuated light reaches the photoelectric conversion layer 102, whereby the S/N ratio of the imaging device decreases in some cases.

Meanwhile, when an In—Ga—Zn oxide is used for the hole injection blocking layer 103 and the oxide layer 110, their electrical conductivities become high enough and the decrease of their light transmittances is relatively small even if at least one of a rare gas, phosphorus, and boron is added to the oxide layer 110. Therefore, it is comparatively preferable to use an In—Ga—Zn oxide for the oxide layer 110, and an In—Ga—Zn oxide is preferably used for the hole injection blocking layer 103.

An electric field is formed in a depletion layer of a pn junction in a pn junction photoelectric conversion element, and carriers generated due to light irradiation are extracted. The width of a depletion layer of an n-type semiconductor layer is preferably reduced to utilize a high light absorption coefficient of selenium. The width of the depletion layer of the n-type semiconductor layer is smaller as the donor density of the n-type semiconductor layer is higher. A method for increasing the donor density of In—Ga—Zn oxide as compared to that of gallium oxide is known. Therefore, the width of a depletion layer can be reduced in the photoelectric conversion element using the In—Ga—Zn oxide, and the imaging device with a high S/N ratio can be achieved.

Note that the oxide layer 110 can be used as an electrode in some cases if its electrical conductivity is sufficiently high.

<Second Electrode 104>

Then, the second electrode 104 will be described. The following can be used for the second electrode 104: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like, for example. In particular, indium tin oxide or indium tin oxide containing silicon is preferably used. The second electrode 104 is not limited to a single layer, and may be a stacked layer of different films. Note that indium tin oxide contains In, Sn, and O.

The second electrode 104 preferably has a high light-transmitting property so that light reaches the photoelectric conversion layer 102. The light-transmitting property is further important especially for the 8K imaging device because an area occupied by one pixel is extremely small and an area which can be used for receiving light is extremely small. The second electrode 104 can be formed by a sputtering method or a plasma CVD method.

Note that if the oxide layer 110 has a sufficiently high electrical conductivity, it is possible in some cases that the oxide layer 110 also serves as the second electrode 104 and the second electrode 104 is not additionally provided.

<Electron Injection Blocking Layer>

An electron injection blocking layer will be described. The electron injection blocking layer is a layer which suppresses electron injection into the photoelectric conversion layer 102 from the first electrode 101 and can be provided between the first electrode 101 and the photoelectric conversion layer 102 although not illustrated in FIGS. 1A and 1B. The electron injection blocking layer can contain nickel oxide, antimony sulfide, or the like.

<Band Diagrams of Photoelectric Conversion Element>

Figure 2:
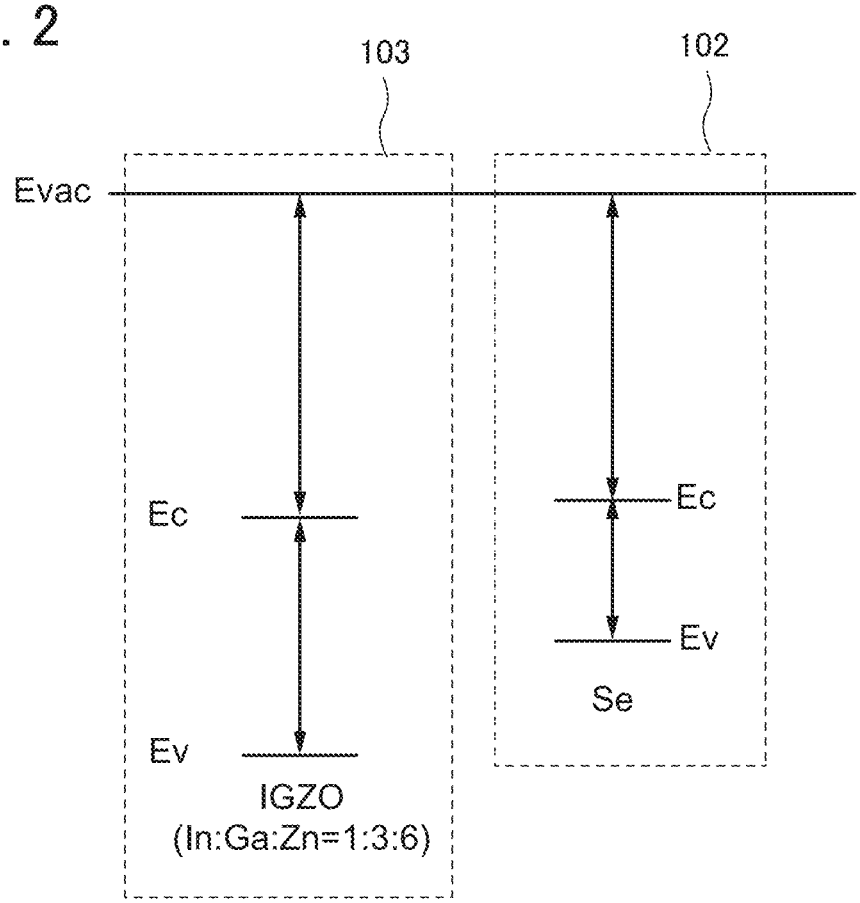
FIG. 2 is a band diagram of a photoelectric conversion layer 102 and a hole injection blocking layer 103.

FIG. 2 illustrates examples of band diagrams of the photoelectric conversion layer 102 and the hole injection blocking layer 103 included in the photoelectric conversion element 100 in FIG. 1A. FIG. 2 illustrates band diagrams of the photoelectric conversion layer 102 using amorphous selenium and the hole blocking layer 103 using an In—Ga—Zn oxide having an atomic ratio of In:Ga:Zn=1:3:6 as a sputtering target. Note that the Fermi levels vary to a certain degree depending on the composition, the crystal structure, or the like of the In—Ga—Zn oxide. Therefore, the In—Ga—Zn oxide can be formed in such a manner that its composition, crystal structure, or the like is selected as appropriate so as to have physical properties required for the hole injection blocking layer 103 which is the objective.

Here, it is known that the electron affinity (a difference in energy between the vacuum level and the bottom of the conduction band) of amorphous selenium is approximately 4.1 eV and the energy gap is 2.0 eV (the electron affinity of crystalline selenium is 4.3 eV and the energy gap is 1.8 eV). The electron affinity of an In—Ga—Zn oxide (In:Ga:Zn=1: 3:6 (atomic ratio)) is approximately 4.5 eV and the energy gap is 3.3 eV. Thus, the band diagram is illustrated as a conceptual diagram of FIG. 2.

The bottom of the conduction band of the In—Ga—Zn oxide is close to that of amorphous selenium; therefore, electrons generated in the photoelectric conversion layer 102 are likely to flow to the hole injection blocking layer 103 formed using the In—Ga—Zn oxide. Thus, the electrons can be sensed as signals relatively easily, and the signal intensity of the photoelectric conversion element 100 is increased. In contrast, the top of the valence band of the In—Ga—Zn oxide is deeper than that of amorphous selenium. Therefore, holes, which cause a dark current, are blocked by a large wall of the hole injection blocking layer 103, and the noise in the photoelectric conversion element 100 is decreased. Accordingly, an imaging device of one embodiment of the present invention including the photoelectric conversion element 100 has a high S/N ratio and improved imaging performance, which makes it easy to perform imaging under a low illuminance condition.

Conversely, in order to improve the S/N ratio of the imaging device, the hole injection blocking layer 103 included in the photoelectric conversion element 100 is preferably formed using a material whose electron affinity is larger than that of the material used for the photoelectric conversion layer 102. For example, when selenium is used for the photoelectric conversion layer 102, a material whose electron affinity is close to 4.1 eV to 4.3 eV is preferably used for the hole injection blocking layer 103. Here, the electron affinity of In—Ga—Zn oxide is generally close to that of selenium as described below. Therefore, an In—Ga—Zn oxide is suited for the hole injection blocking layer 103 included in the imaging device in which selenium is used for the photoelectric conversion layer 102.

Furthermore, a material whose top of the valence band is deeper than that of a material used for the photoelectric conversion layer 102 is preferably used for the hole injection blocking layer 103 so that the S/N ratio in the imaging device is improved. As described above, when the bottom of the conduction band of the material of the hole injection blocking layer 103 is almost the same as that of a material of the photoelectric conversion layer 102, the band gap (a difference between the top of the valence band and the bottom of the conduction band bottom) of the hole injection blocking layer 103 is preferably larger than the band gap of the photoelectric conversion layer 102. That is, when selenium is used for the photoelectric conversion layer 102, a material whose band gap is larger than 2.0 eV is preferably used for the hole injection blocking layer 103 because the band gap of selenium is from 1.8 eV to 2.0 eV. Here, the electron affinity of In—Ga—Zn oxide is generally larger than that of selenium as described below. Therefore, an In—Ga—Zn oxide is suited for the hole injection blocking layer 103 included in the imaging device in which selenium is used for the photoelectric conversion layer 102.

Figure 21A:
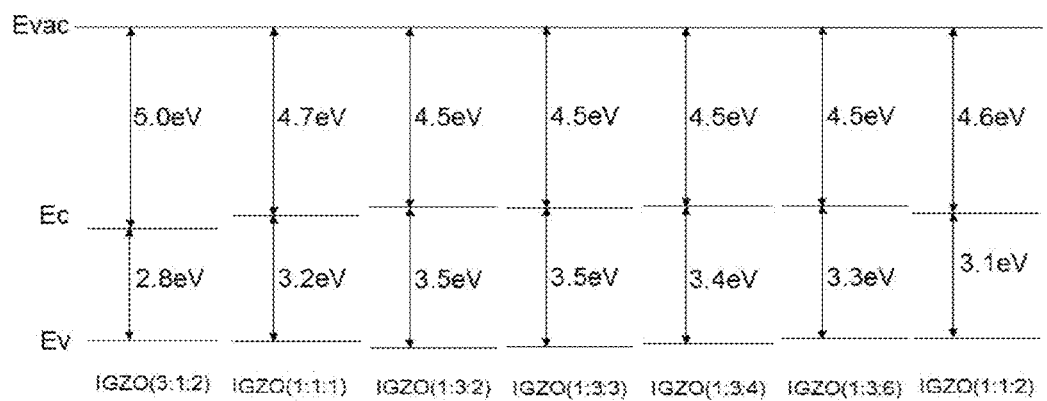
FIGS. 21A and 21B show electron affinity and energy gaps of IGZO films.
Figure 21B:
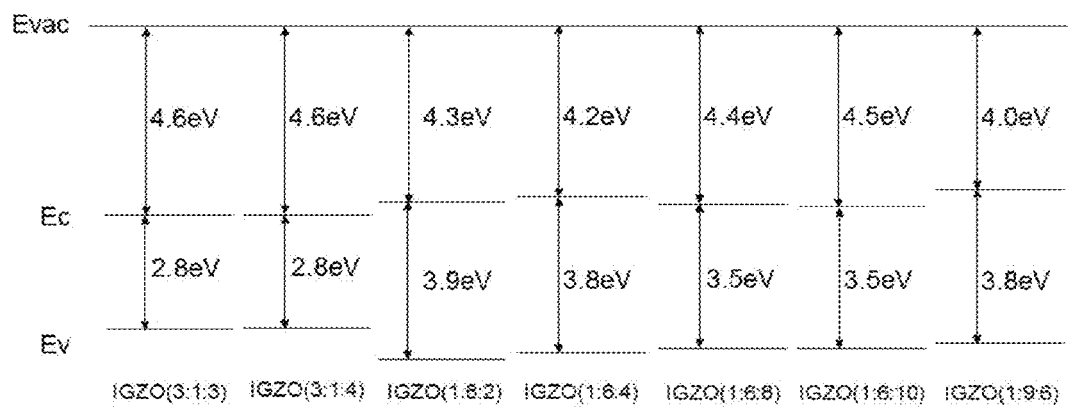

Here, FIGS. 21A and 21B show electron affinities and energy gaps of In—Ga—Zn oxides. As shown in FIGS. 21A and 21B, it is understandable that an In—Ga—Zn oxide having a composition other than the atomic ratio of In:Ga:Zn=1:3:6 as the sputtering target is also suited for a hole injection blocking layer. The use of In—Ga—Zn oxide is more advantageous than the use of gallium oxide because a desired energy gap can be obtained by selecting compositions of In—Ga—Zn oxide.

<Addition of Rare Gas, Phosphorus, and/or Boron to Layer Including In—Ga—Zn Oxide>

Next, addition of a rare gas, phosphorus, and/or boron to a layer including an In—Ga—Zn oxide for formation of the oxide layer 110, for example, will be described. Note that the addition that will be described is not limited to the addition for the formation of the oxide layer 110.

As a material to be added, helium (He), neon (Ne), argon (Ar), krypton (Kr), xenon (Xe), boron (B), phosphorus (P), or the like can be used. One of them may be added, or two elements or more may be added. When two elements or more are added, all of them may be added at the same time, or they may be added at different timings. The addition can be performed by an ion implantation method, a plasma immersion ion implantation method, high-density plasma treatment, or the like. From a viewpoint of miniaturization, an ion implantation method is preferable because addition of impurities other than the predetermined ions can be suppressed. A large area can be effectively treated by a plasma immersion ion implantation method.

The ion accelerating voltage for the ion addition treatment is preferably controlled in accordance with the ion species and implantation depth. For example, the ion accelerating voltage can be higher than or equal to 1 kV and lower than or equal to 100 kV, or higher than or equal to 3 kV and lower than or equal to 60 kV. The dose of the ions is preferably greater than or equal to $1\times10^{12}$ ions/cm$^2$ and less than or equal to $1\times10^{17}$ ions/cm$^2$, further preferably greater than or equal to $1\times10^{13}$ ions/cm$^2$ and less than or equal to $5\times10^{16}$ ions/cm$^2$.

A donor level is formed in the layer including an In—Ga—Zn oxide through the ion addition treatment, and a low-resistance region can be provided. The region can be the oxide layer 110.

Heat treatment performed after the ion addition treatment can repair damage caused to a film during the ion addition treatment.

The structure described in this embodiment can be used in appropriate combination with the structure described in any of the other embodiments.

(Embodiment 2)

Figure 3A:
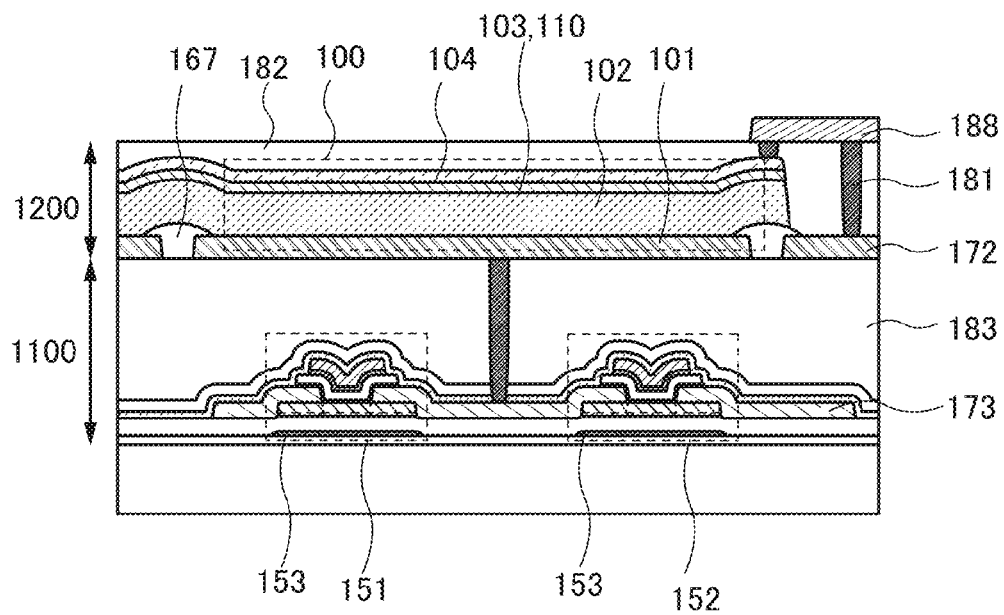
FIGS. 3A to 3C are cross-sectional views each illustrating a structure of an imaging device.

Next, specific structure examples of an imaging device of one embodiment of the present invention will be described with reference to drawings. FIG. 3A is an example of a cross-sectional view of an imaging device of one embodiment of the present invention and illustrates an example of specific connection between the photoelectric conversion element 100 in FIG. 1A and driver transistors. The imaging device includes a layer 1100 including a transistor 151 and a transistor 152 and a layer 1200 including the photoelectric conversion element 100.

Although the wirings, the electrodes, and the conductors are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor is only an example, and the gate electrode, the source electrode, and the drain electrode of the transistor might each function as a wiring.

In addition, an insulating layer 182, an insulating layer 183, and the like that function as protective films, interlayer insulating films, or planarization films are provided over the components. For example, an inorganic insulating film such as a silicon oxide film or a silicon oxynitride film can be used as each of the insulating layers 182 and 183 and the like. Alternatively, an organic insulating film such as an acrylic resin film or a polyimide resin film may be used. Top surfaces of the insulating layers 182 and 183 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included in the stacked-layer structure. Furthermore, one or more of the layers illustrated in the drawing are not included in some cases.

It is particularly preferable to use transistors including an oxide as a semiconductor (OS transistors) as the transistors 151 and 152.

Extremely low off-state current characteristics of the OS transistor can widen the dynamic range of imaging. Since the transistor using an oxide semiconductor has an extremely small off-state current, a current corresponding to the gate potential can be accurately output even when the gate potential is extremely low. Thus, it is possible to widen the detection range of illuminance, i.e., the dynamic range.

A period during which charge can be held in the charge accumulation portion can be extremely long owing to the low off-state current of the transistors 151 and 152. Therefore, a global shutter system in which accumulation operation is performed in all the pixels at the same time can be used without a complicated circuit structure and operation method.

Figure 22A:
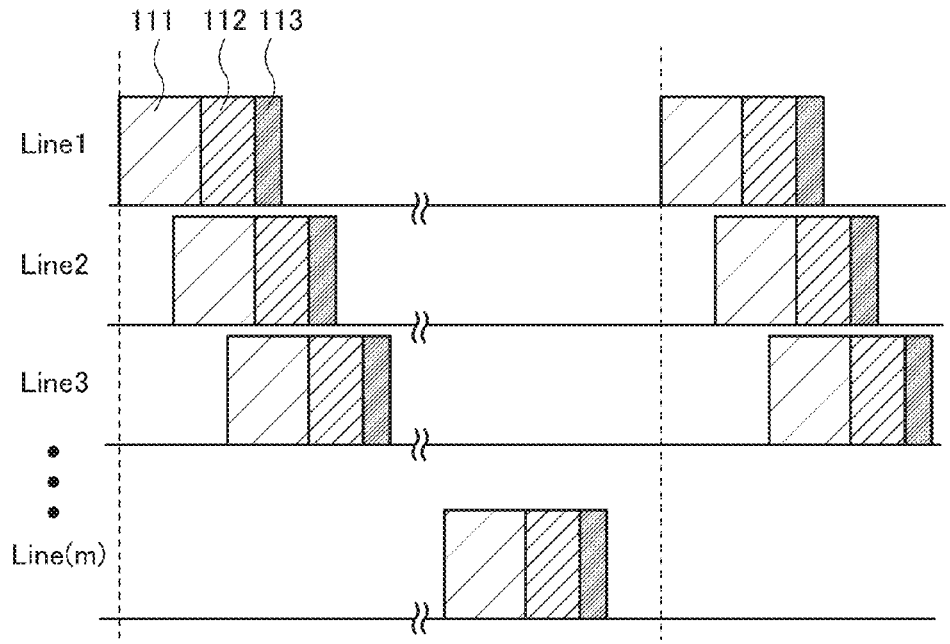
FIGS. 22A and 22B show operations of a rolling shutter system and a global shutter system, respectively.

In general, in an imaging device where pixels are arranged in a matrix, a rolling shutter system is employed in which imaging operation 111, data storage operation 112, and reading operation 113 are performed row by row as illustrated in FIG. 22A. In the case of employing the rolling shutter system, simultaneousness of imaging is lost. Therefore, when an object moves, an image is distorted.

Figure 22B:
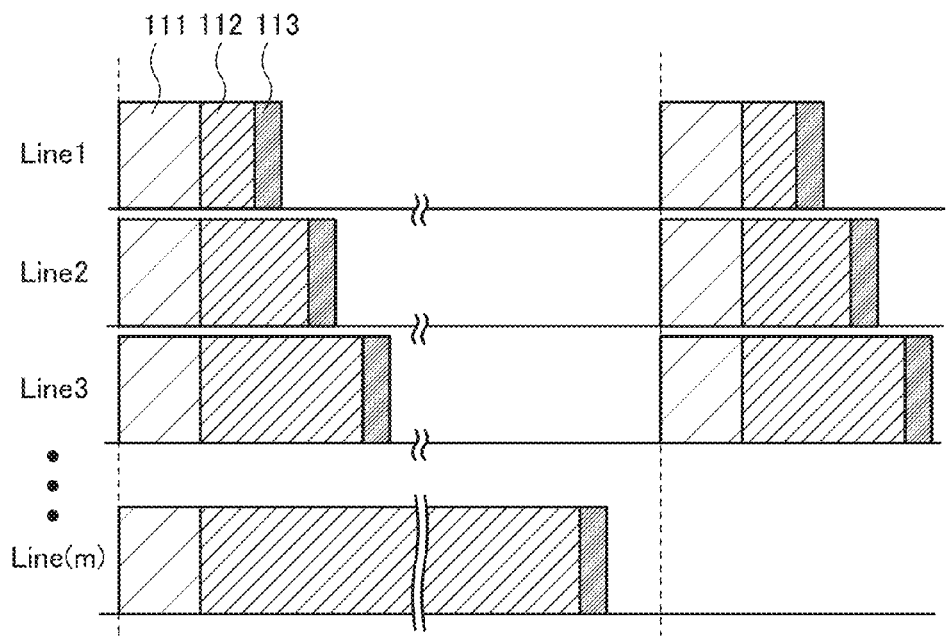

As a result, in one embodiment of the present invention, it is preferable to employ a global shutter system in which the imaging operation 111 can be performed simultaneously in all the rows and the read operation 113 can be sequentially performed row by row as illustrated in FIG. 22B. By employing the global shutter system, simultaneousness of imaging in all the pixels in the imaging device can be secured, and an image with little distortion can be easily obtained even when an object moves. Furthermore, exposure time (a period for conducting charge accumulation operation) can be long in a global shutter system; thus, the imaging device is suitable for imaging even in a low illuminance environment.

In addition, the OS transistor has lower temperature dependence of change in electrical characteristics than a transistor including silicon in an active region or an active layer (hereinafter referred to as a Si transistor), and thus can be used in an extremely wide range of temperatures. Therefore, an imaging device and a semiconductor device that include OS transistors are suitable for use in automobiles, aircrafts, spacecrafts, and the like.

Moreover, the OS transistor has higher drain breakdown voltage than the Si transistor. In a photoelectric conversion element including a selenium-based material in a photoelectric conversion layer, a relatively high voltage (e.g., 10 V or higher) is preferably applied so that an avalanche phenomenon easily causes. Therefore, by combination of the OS transistor and the photoelectric conversion element including a selenium-based material in the photoelectric conversion layer, a highly reliable imaging device can be obtained.

Figure 3B:
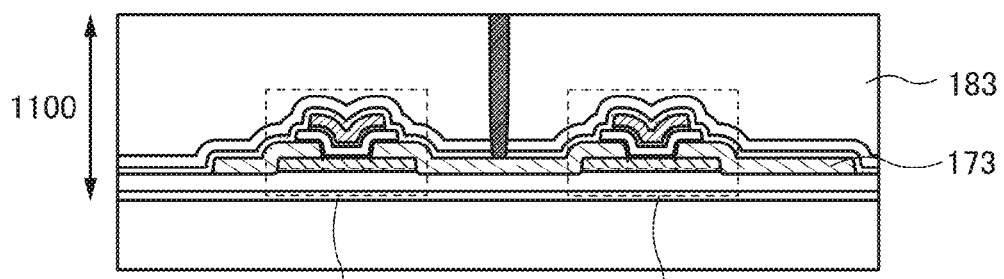
Figure 3C:
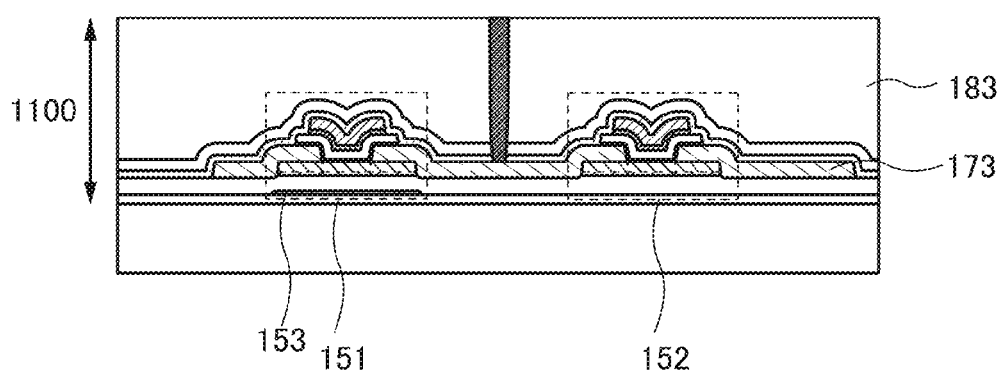

Note that although each transistor includes a back gate 153 in FIG. 3A, each transistor does not necessarily include a back gate as illustrated in FIG. 3B. Alternatively, as illustrated in FIG. 3C, some of transistors, for example, only the transistor 151 may include the back gate 153. The back gate might be electrically connected to a front gate of the transistor, which is provided to face the back gate. Alternatively, different fixed potentials might be supplied to the back gate and the front gate. Note that the presence or absence of the back gate can also be applied to another imaging device described in this embodiment.

A variety of elements can be used as the photoelectric conversion element 100 provided in the layer 1200. FIG. 3A illustrates the photoelectric conversion element 100 including a selenium-based material for the photoelectric conversion layer 102.

The photoelectric conversion element 100 including a selenium-based material has high internal quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, which leads to an advantage that the photoelectric conversion layer 102 can be formed thin easily.

The materials described in Embodiment 1 can be used as a material used for each layer in the photoelectric conversion element 100. Note that, as described in Embodiment 1, the border between the hole injection blocking layer 103 and the oxide layer 110 is not clear in some cases; thus, the layers are shown as one single layer in the drawings of this embodiment. In reality, the hole injection blocking layer 103 is provided on the side in contact with the photoelectric conversion layer 102 and the oxide layer 110 is provided on the side in contact with the second electrode 104 as shown in FIG. 1A.

Figure 4A:
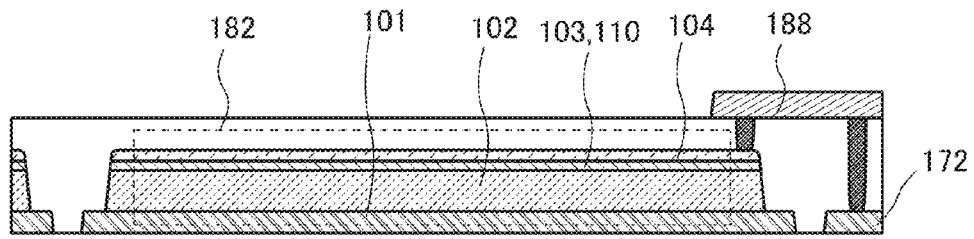
FIGS. 4A to 4D are cross-sectional views each illustrating a connection configuration of a photoelectric conversion element.
Figure 4B:
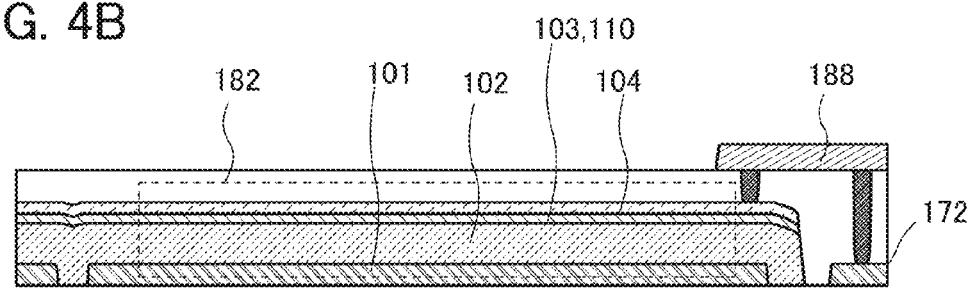
Figure 4C:
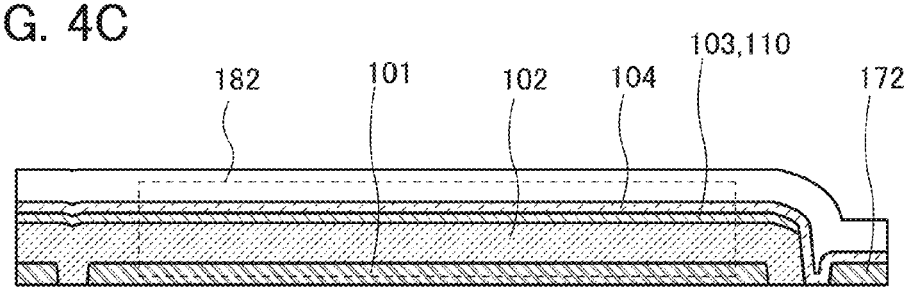
Figure 4D:
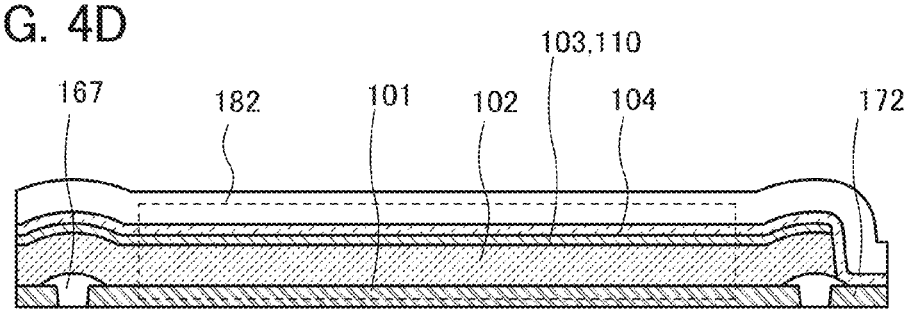

Although the photoelectric conversion layer 102 and the light-transmitting second electrode 104 are not divided between photoelectric conversion elements in FIG. 3A, they may be divided between photoelectric conversion elements as illustrated in FIG. 4A. In a region, between pixels, where the first electrode 101 is not provided, a partition wall 167 formed of an insulator is preferably provided, thereby preventing generation of a crack in the photoelectric conversion layer 102 and the light-transmitting second electrode 104. However, the partition wall 167 is not necessarily provided as illustrated in FIG. 4B. Although the light-transmitting second electrode 104 and the wiring 172 are connected to each other through a wiring 188 and a conductor 181 in FIG. 3A, the light-transmitting second electrode 104 and the wiring 172 may be in direct contact with each other as in FIGS. 4C and 4D.

The first electrode 101 illustrated in FIG. 3A, and FIGS. 4A to 4D preferably has high planarity in order to prevent a short circuit with the light-transmitting second electrode 104 caused by, for example, poor coverage with the photoelectric conversion layer 102.

Note that the partition wall 167 can be formed using an inorganic insulator, an insulating organic resin, or the like. The partition wall 167 may be colored black or the like in order to shield the transistors and the like from light and/or to determine the area of a light-receiving portion in each pixel.

The photoelectric conversion element 100 may include an electron injection blocking layer in addition to the hole injection blocking layer 103 and the oxide layer 110.

Figure 5:
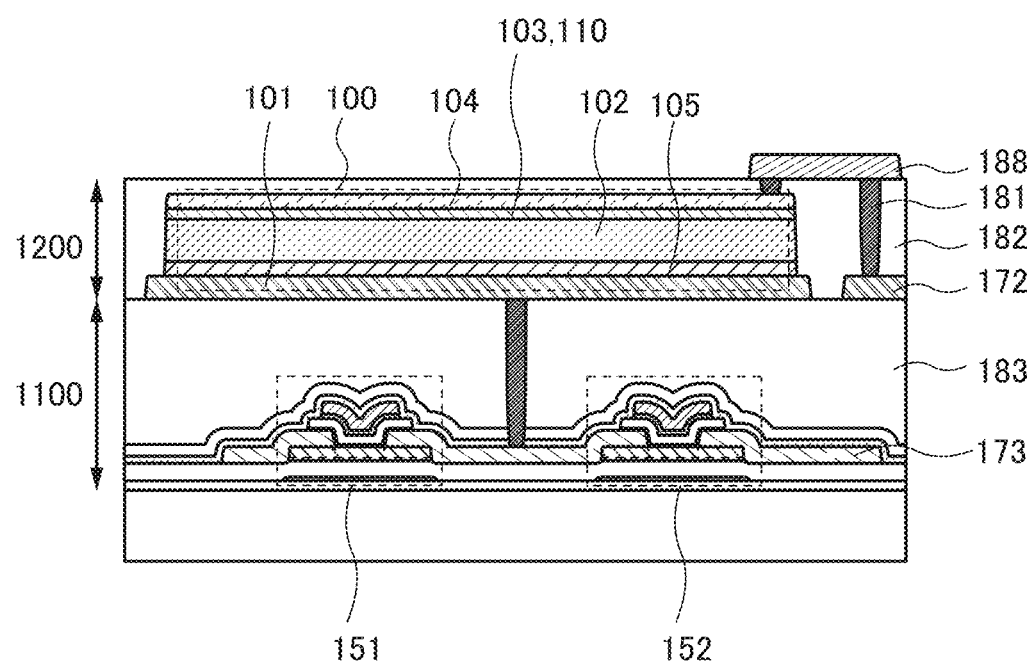
FIG. 5 is a cross-sectional view illustrating a structure of an imaging device.

For example, FIG. 5 is an example in which the photoelectric conversion element 100 includes the hole injection blocking layer 103, the oxide layer 110, and the electron injection blocking layer 105. In the photoelectric conversion element, the electron injection blocking layer 105, the photoelectric conversion layer 102, and the hole injection blocking layer 103 are stacked in this order. The photoelectric conversion layer 102 is preferably a crystalline selenium layer. The materials described in Embodiment 1 can be used for the hole injection blocking layer 103. The electron injection blocking layer 105 can contain nickel oxide, antimony sulfide, or the like.

In the photoelectric conversion element 100 in FIG. 5, the electron injection blocking layer 105 is electrically connected to the first electrode 101 that is electrically connected to the transistors 151 and 152. Furthermore, the light-transmitting second electrode 104 is electrically connected to the wiring 172 through the wiring 188 and the conductor 181.

FIGS. 6A to 6F show other examples of the structure of the photoelectric conversion element 100 including the hole injection blocking layer 103, the oxide layer 110, and the electron injection blocking layer 105 and the connection configuration between the photoelectric conversion element 100 and the wirings. Note that at least one of the hole injection blocking layer 103, the oxide layer 110, and the electron injection blocking layer 105 is omitted in some cases as illustrated in FIGS. 6A to 6F. Note that the structure of the photoelectric conversion element 100 and the connection configuration between the photoelectric conversion element 100 and the wirings are not limited thereto, and other configurations may be applied.

Figure 6A:
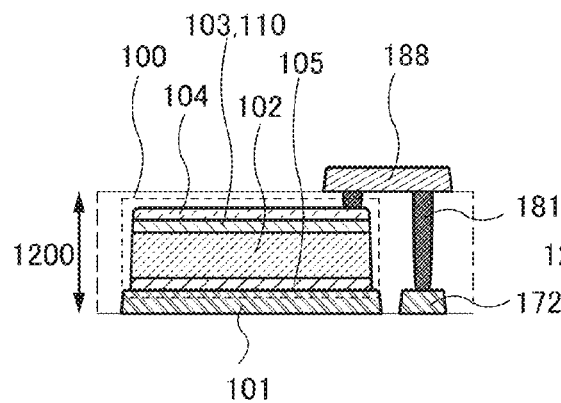
FIGS. 6A to 6F are cross-sectional views each illustrating a connection configuration of a photoelectric conversion element.

FIG. 6A illustrates a structure in which the light-transmitting second electrode 104 is provided close to the hole injection blocking layer 103 with the oxide layer 110 therebetween. The light-transmitting second electrode 104 serves as an electrode and can increase the output current of the photoelectric conversion element 100.

For the light-transmitting second electrode 104, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like, for example. The light-transmitting second electrode 104 is not limited to a single layer, and may be a stacked layer of different films.

Figure 6B:
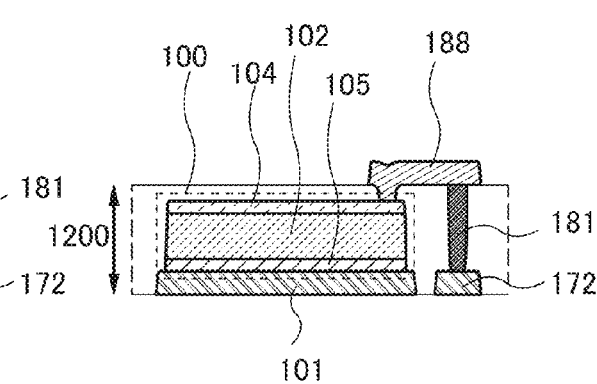

FIG. 6B illustrates a structure of the photoelectric conversion element 100 in which the electron injection blocking layer 105 is provided in contact with the first electrode 101 and the light-transmitting second electrode 104 is electrically connected to the wiring 188.

Figure 6C:
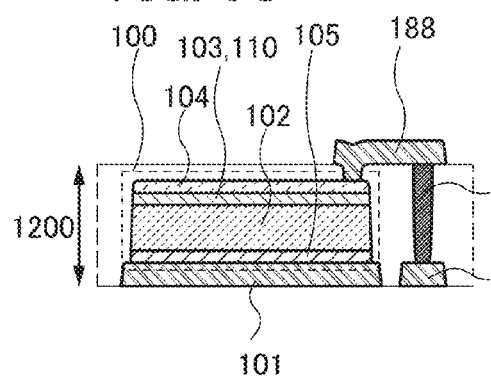

FIG. 6C illustrates a structure in which the light-transmitting second electrode 104 is provided close to the hole injection blocking layer 103 with the oxide layer 110 therebetween and the wiring 188 is electrically connected to the light-transmitting second electrode 104.

Figure 6D:
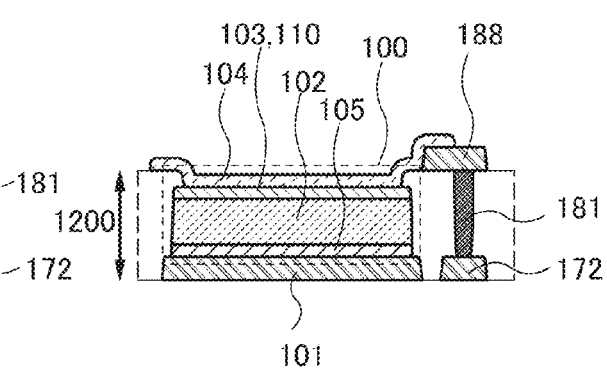

FIG. 6D illustrates a structure in which an opening exposing the oxide layer 110 is provided in an insulating layer covering the photoelectric conversion element 100, and the light-transmitting second electrode 104 that covers the opening is electrically connected to the wiring 188.

Figure 6E:
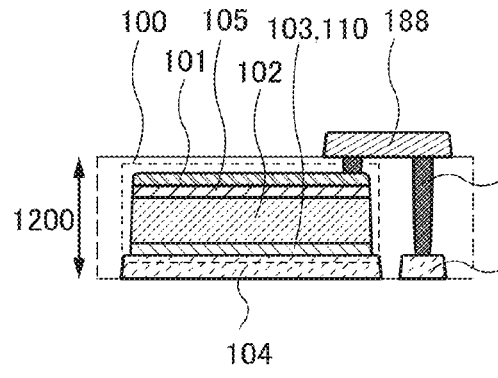

FIG. 6E includes an upside-down stack structure of the photoelectric conversion element 100 in FIG. 6A. External light may be received through the light-transmitting second electrode 104. In that case, the photoelectric conversion element 100 in FIG. 6E receives light from the substrate side; thus, the substrate also has light-transmitting property.

Figure 6F:
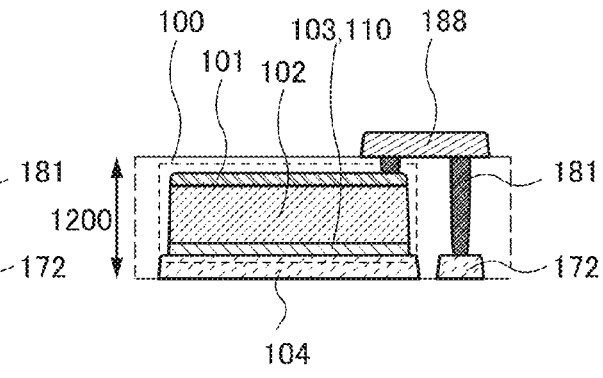

FIG. 6F illustrates the photoelectric conversion element 100 in FIG. 6E in which an electron injection blocking layer is not provided.

In the photoelectric conversion elements 100 in FIGS. 6E and 6F, the hole injection blocking layer 103 is provided over the light-transmitting second electrode 104. An In—Ga—Zn oxide film is formed over the second electrode 104, and then, at least one of a rare gas, phosphorus, and boron is added thereto from the top side of the film. A portion which becomes conductive by addition of a rare gas, phosphorus, and/or boron is used as the oxide layer 110, and the other portion of the film is used as the hole injection blocking layer 103. For example, in the case where an indium tin oxide film or an indium tin oxide film to which silicon is added is used as the light-transmitting second electrode 104, an In—Ga—Zn oxide or the like is used for the hole injection blocking layer 103, and an In—Ga—Zn oxide is used for the oxide layer 110, any of the oxide layer 110, the hole injection blocking layer 103, and the second electrode 104 is an oxide containing indium and have a close composition; therefore, they are well suited to each other. That is, adhesion at the interfaces between the oxide layer 110, the hole injection blocking layer 103, and the second electrode 104 is improved and the electrical conductivity is improved.

When the second electrode 104 in the structure of FIG. 6E or 6F has a crystal, crystallinity of the hole injection blocking layer 103 can be easily increased. When the hole injection blocking layer 103 has a crystal, the oxide layer 110 is also crystallized to a certain degree, and furthermore, crystallinity of the photoelectric conversion layer 102 can be easily increased. Therefore, adhesion between the photoelectric conversion layer 102 and the oxide layer 110 and the hole injection blocking layer 103 is improved and the interface has a preferable property.

Thus, when an indium tin oxide film or an indium tin oxide film to which silicon is added is used as the light-transmitting second electrode 104, an In—Ga—Zn oxide or the like is used for the hole injection blocking layer 103, an In—Ga—Zn oxide or the like is used for the oxide layer 110, and a crystalline selenium layer is used as the photoelectric conversion layer 102, for example, the interfaces included in the photoelectric conversion element 100 have a preferable property and obtain high durability and a high electrical conductivity.

The photoelectric conversion element 100 formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 102 does not need to be divided between circuits as illustrated in FIG. 3A. Therefore, the imaging device of one embodiment of the present invention can be manufactured with a high yield at low cost. In contrast, a photodiode including a silicon substrate as a photoelectric conversion layer requires difficult processes such as a polishing process and a bonding process.

Figure 7A:
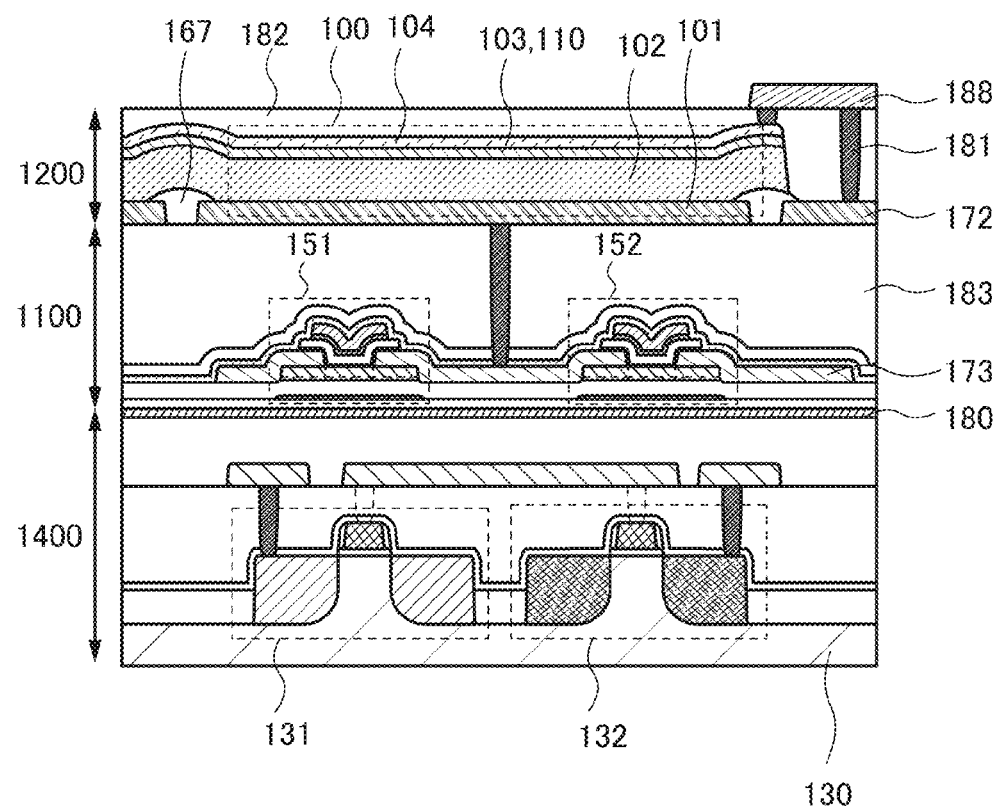
FIGS. 7A and 7B are cross-sectional views each illustrating a structure of an imaging device.
Figure 7B:
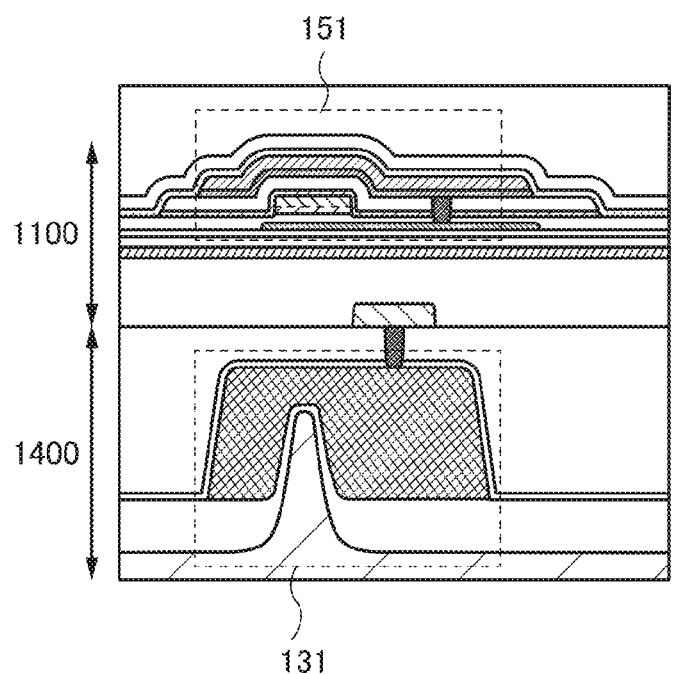

Furthermore, in the imaging device of one embodiment of the present invention, a stack including the silicon substrate 130 in which a circuit is formed may be used. For example, as illustrated in FIG. 7A, a pixel circuit may overlap with a layer 1400 that includes a transistor 131 and a transistor 132 whose active regions are formed in the silicon substrate 130. FIG. 7B corresponds to a cross-sectional view illustrating the transistor in the channel width direction.

Figure 8A:
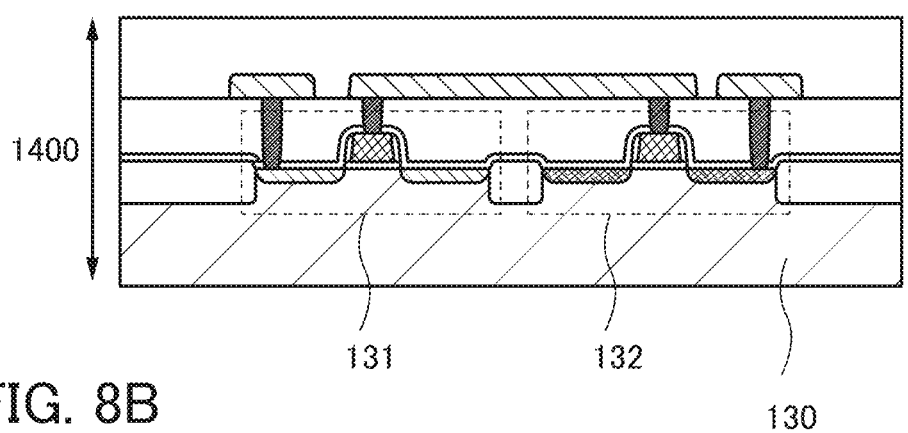
FIGS. 8A and 8B are cross-sectional views each illustrating a structure of an imaging device.
Figure 8B:
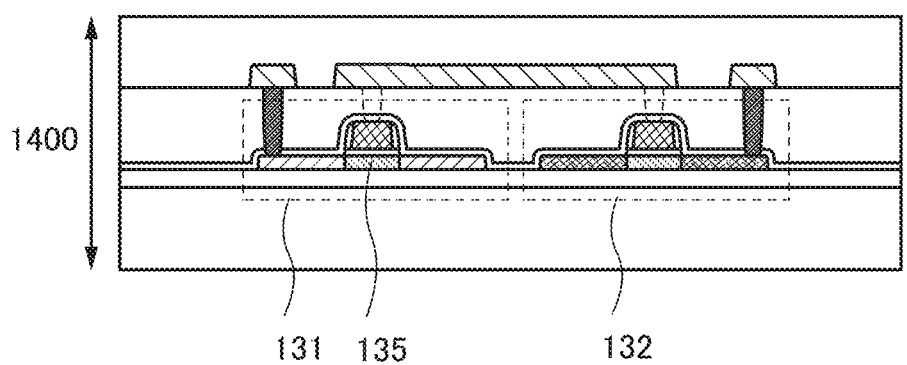

Although FIGS. 7A and 7B show the Si transistors of a fin type, the transistors may be of a planar type as illustrated in FIG. 8A. Alternatively, as illustrated in FIG. 8B, they may be transistors each including an active layer 135 formed using a silicon thin film. The active layer 135 can be formed using polycrystalline silicon or single crystal silicon of a silicon-on-insulator (SOI) structure.

The silicon substrate 130 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 7A, an insulating layer 180 is provided between a region including an oxide semiconductor transistor and a region including a Si transistor.

Dangling bonds of silicon are terminated with hydrogen in insulating layers provided in the vicinities of the active regions of the transistors 131 and 132. Therefore, hydrogen has an effect of improving the reliability of the transistors 131 and 132. Meanwhile, hydrogen in insulating layers provided in the vicinity of the oxide semiconductor layer that is the active layer of the transistor 151 or the like causes generation of carriers in the oxide semiconductor layer. Therefore, the hydrogen may reduce the reliability of the transistor 151 or the like. Thus, the insulating layer 180 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 180, so that the reliability of the transistors 131 and 132 can be improved. Furthermore, diffusion of hydrogen from the one layer to the other layer is inhibited, so that the reliability of the transistor 151 or the like can also be improved.

The insulating layer 180 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 7A, a circuit (e.g., a driver circuit) formed on the silicon substrate 130, the transistor 151 or the like, and the photoelectric conversion element 100 can overlap with each other; thus, the integration degree of pixels can be increased. In other words, the resolution of the imaging device can be increased. Such a structure is suitable for an imaging device with, for example, 4K2K, 8K4K, or 16K8K pixels.

In the imaging device in FIG. 7A, the silicon substrate 130 is not provided with a photoelectric conversion element. Therefore, an optical path for the photoelectric conversion element 100 can be secured without being influenced by the transistors or wirings, and a pixel with a high aperture ratio can be formed.

Figure 9:
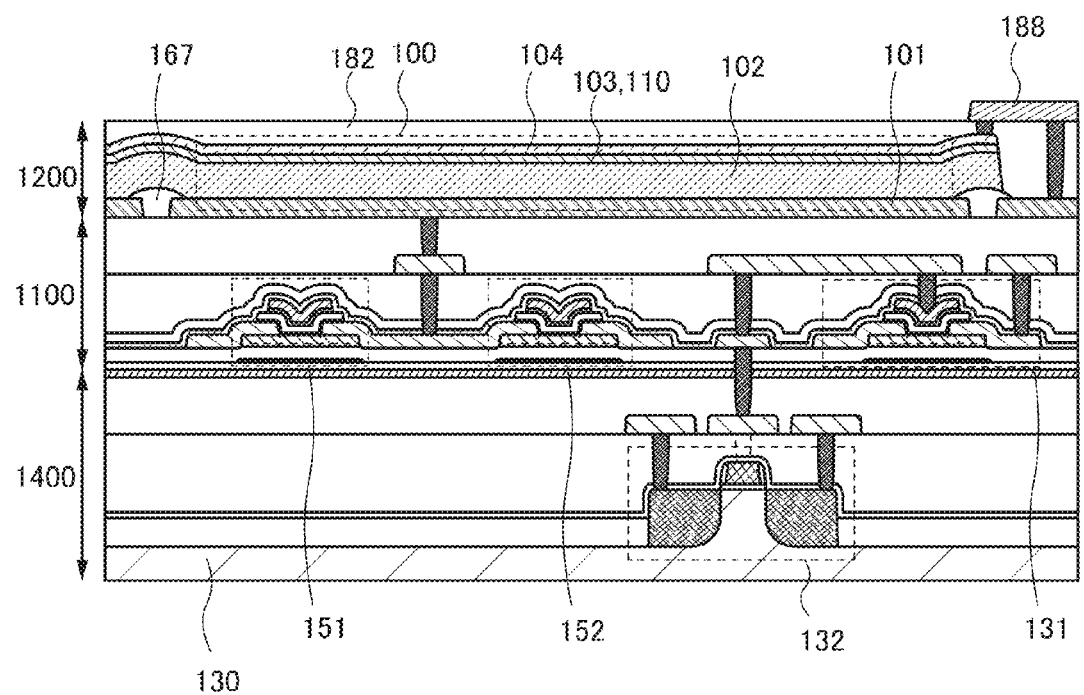
FIG. 9 is a cross-sectional view illustrating a structure of an imaging device.

The imaging device of one embodiment of the present invention can also have a structure in FIG. 9.

The imaging device in FIG. 9 is a modification example of the imaging device in FIG. 7A. A CMOS inverter is formed using an OS transistor and a Si transistor.

Here, the transistor 132 is a p-channel Si transistor provided in the layer 1400, and the transistor 131 is an n-channel OS transistor provided in the layer 1100. When only the p-channel transistor is provided on the silicon substrate 130, a step of forming a well, an n-type impurity layer, or the like can be skipped.

In the imaging device in FIG. 9, the transistor 131 can be formed through the same process as those of the transistors 151 and 152 formed in the layer 1100. Thus, the manufacturing process of the imaging device can be simplified.

Figure 10A:
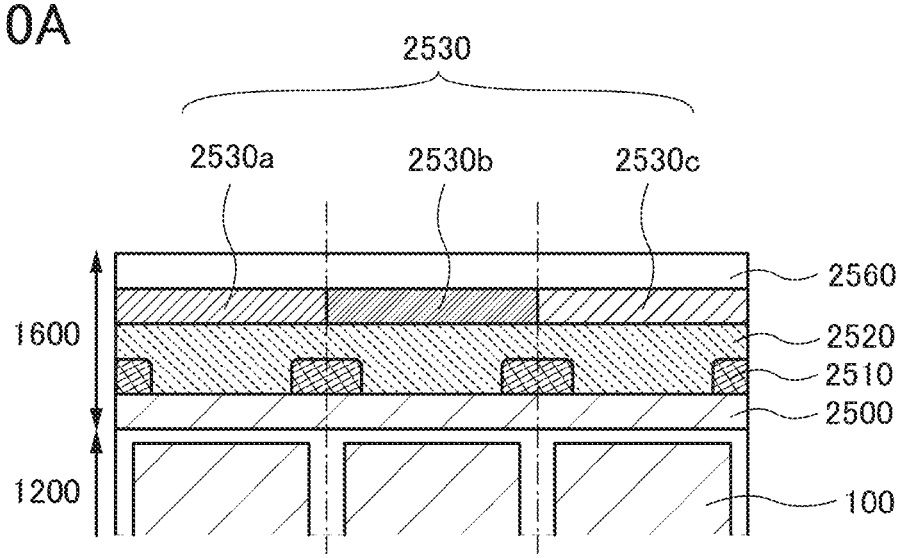
FIGS. 10A to 10C are cross-sectional views each illustrating a structure of an imaging device.

FIG. 10A is a cross-sectional view of an example of a mode in which a color filter and the like are added to the imaging. The cross-sectional view illustrates part of a region including pixel circuits for three pixels. An insulating layer 2500 is formed over the layer 1200 where the photoelectric conversion element 100 is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the upper color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 10B:
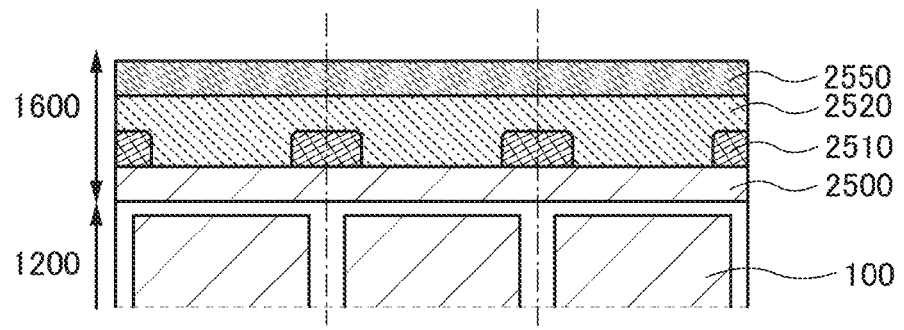

As illustrated in FIG. 10B, a photoelectric conversion layer 2550 may be used instead of the color filter 2530. Such a structure enables the imaging device to capture images in various wavelength regions.

For example, when a filter that blocks light having a wavelength shorter than or equal to that of visible light is used as the photoelectric conversion layer 2550, an infrared imaging device can be obtained. When a filter that blocks light having a wavelength shorter than or equal to that of near infrared light is used as the photoelectric conversion layer 2550, a far infrared imaging device can be obtained. When a filter that blocks light having a wavelength longer than or equal to that of visible light is used as the photoelectric conversion layer 2550, an ultraviolet imaging device can be obtained.

Furthermore, when a scintillator is used as the photoelectric conversion layer 2550, an imaging device that captures an image visualizing the intensity of radiation and is used for an X-ray imaging device or the like can be obtained. Radiation such as X-rays passes through an object to enter a scintillator, and then is converted into light (fluorescence) such as visible light or ultraviolet light owing to a phenomenon known as photoluminescence. Then, the photoelectric conversion element 100 detects the light to obtain image data. Furthermore, the imaging device having the structure may be used in a radiation detector or the like.

A scintillator is formed of a substance that, when irradiated with radiation such as X-rays or gamma rays, absorbs energy of the radiation to emit visible light or ultraviolet light or a material containing the substance. Examples of the known materials include $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO, and a resin or ceramics in which any of the materials is dispersed.

In the photoelectric conversion element 100 using a selenium-based material, radiation such as X-rays can be directly converted into charge; thus, the scintillator is not necessarily used.

A microlens array 2540 may be provided over the color filters 2530a, 2530b, and 2530c. Light penetrating lenses included in the microlens array 2540 goes through the color filters positioned directly thereunder to reach the photoelectric conversion element 100. Note that a region other than the layer 1200 in FIGS. 10A to 10C is referred to as a layer 1600.

Figure 10C:
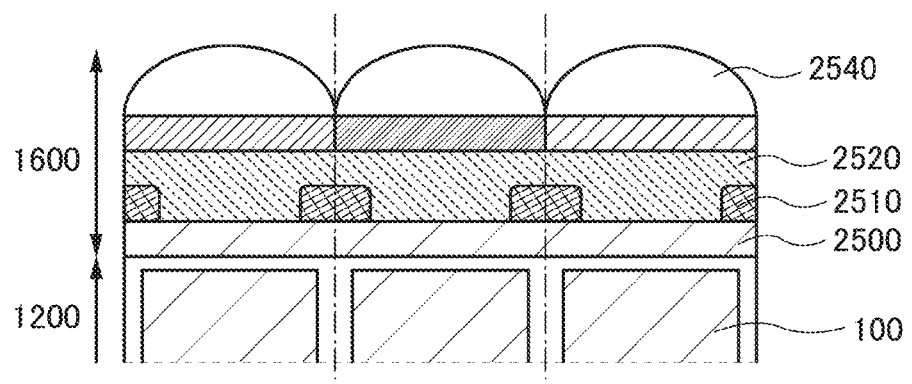
Figure 11:
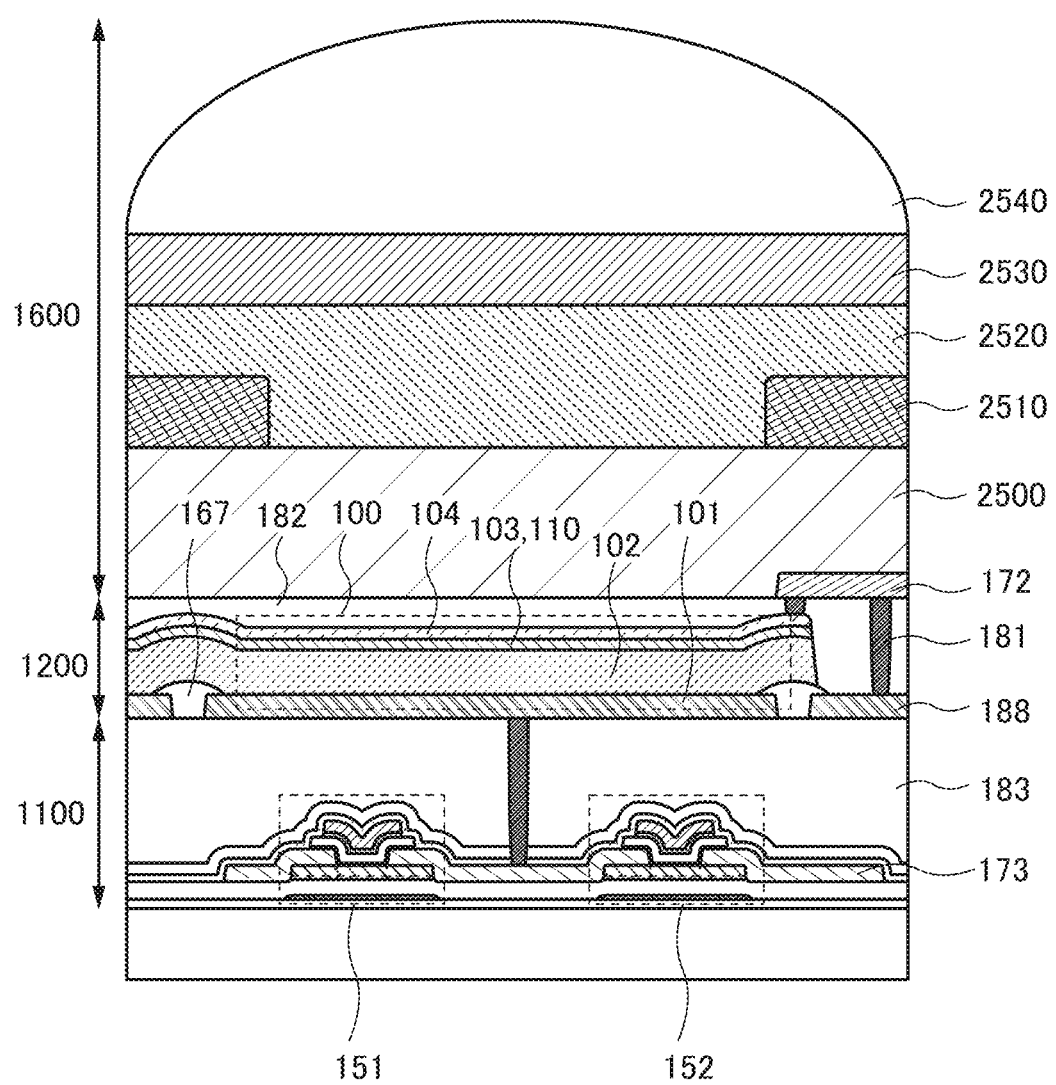
FIG. 11 is a cross-sectional view illustrating a structure of an imaging device.

The specific structure of the imaging device in FIG. 10C is illustrated in FIG. 11 by taking an example of the imaging device in FIG. 3A.

Figure 12:
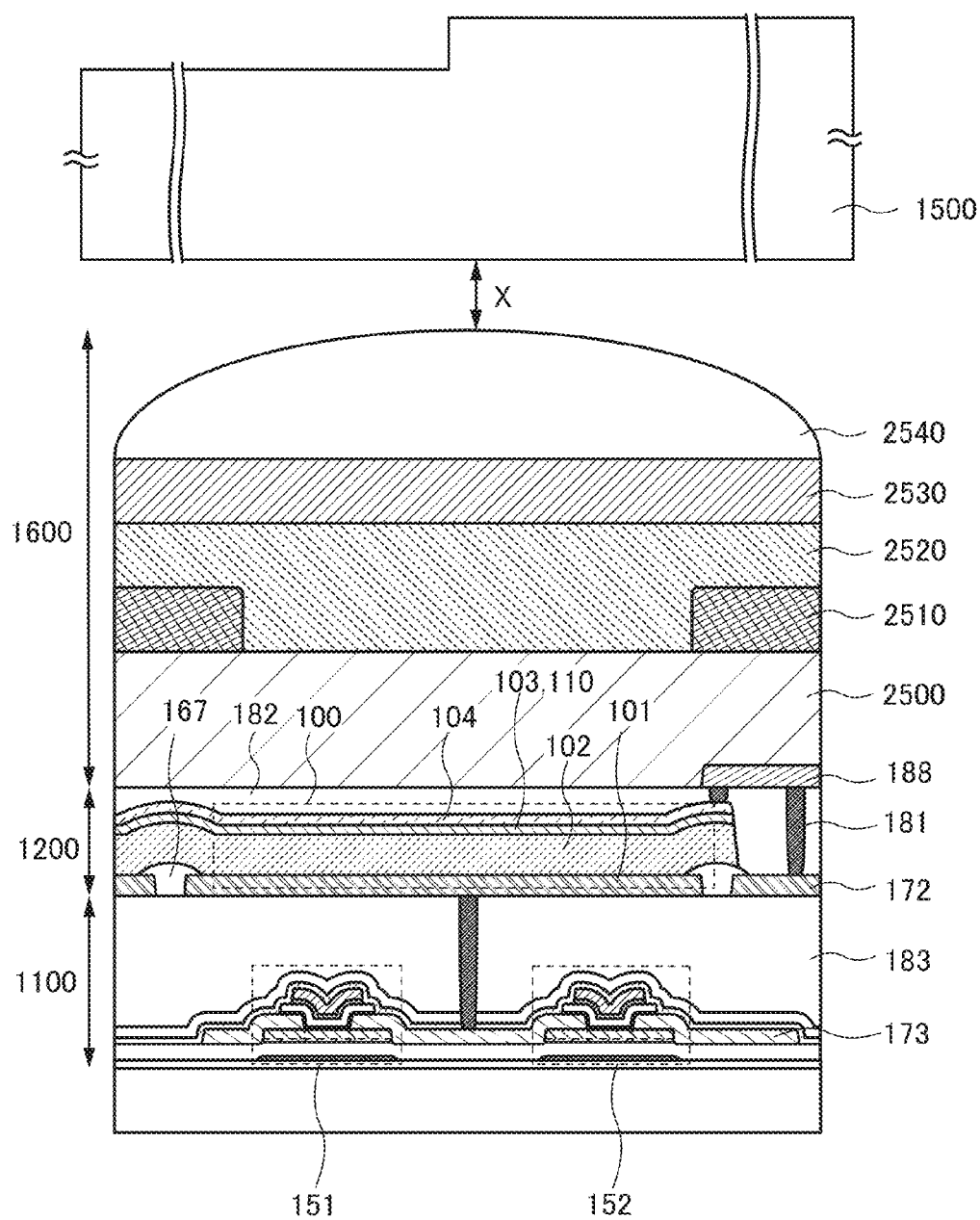
FIG. 12 is a cross-sectional view illustrating a structure of an imaging device.
Figure 13:
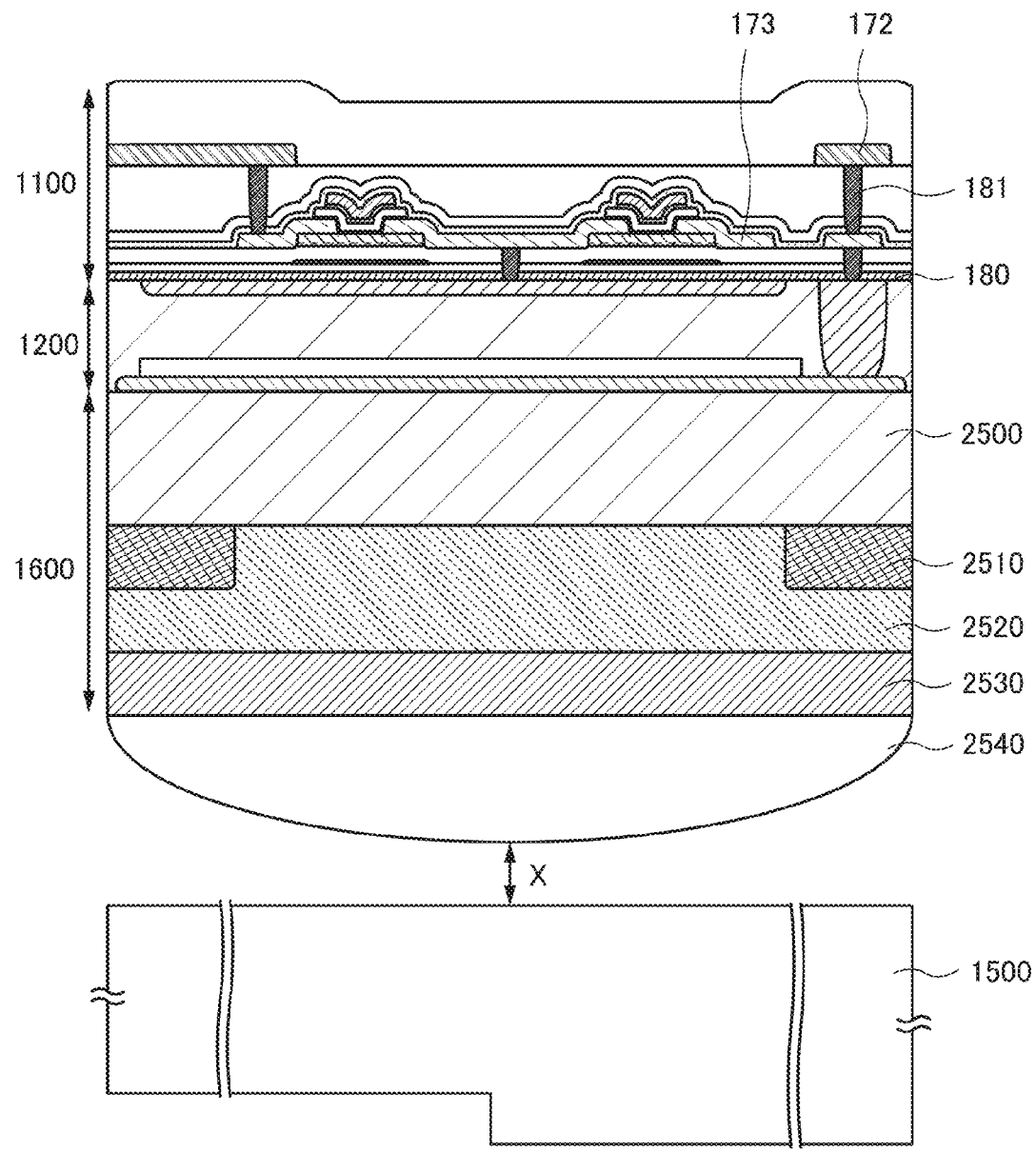
FIG. 13 is a cross-sectional view illustrating a structure of an imaging device.

The imaging device of one embodiment of the present invention may be combined with a diffraction grating 1500 as illustrated in FIG. 12 and FIG. 13. An image of an object obtained through the diffraction grating 1500 (i.e., a diffraction pattern) is scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 14A1 and 14B1, the imaging device may be bent. FIG. 14A1 illustrates a state in which the imaging device is bent in the direction of dashed-two dotted line X1-X2. FIG. 14A2 is a cross-sectional view illustrating a portion indicated by dashed-two dotted line X1-X2 in FIG. 14A1. FIG. 14A3 is a cross-sectional view illustrating a portion indicated by dashed-two dotted line Y1-Y2 in FIG. 14A1.

FIG. 14B1 illustrates a state where the imaging device is bent in the direction of dashed-two dotted line X3-X4 and the direction of dashed-two dotted line Y3-Y4. FIG. 14B2 is a cross-sectional view illustrating a portion indicated by dashed-two dotted line X3-X4 in FIG. 14B1. FIG. 14B3 is a cross-sectional view illustrating a portion indicated by dashed-two dotted line Y3-Y4 in FIG. 14B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In Embodiment 2, one embodiment of the present invention has been described. Other embodiments of the present invention will be described in Embodiments 1, 3, and 4. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which an In—Ga—Zn oxide is used in the photoelectric conversion element as the oxide layer over the hole injection blocking layer is described as one embodiment of the present invention, one embodiment of the present invention is not limited thereto. Depending on circumstances or conditions, the oxide layer in one embodiment of the present invention may be provided under the hole injection blocking layer. Depending on circumstances or conditions, the oxide layer in one embodiment of the present invention may include, for example, at least one of He, Ne, Ar, Kr, Xe, P, and B. Alternatively, for example, depending on circumstances or conditions, one embodiment of the present invention does not necessarily include an oxide layer including an In—Ga—Zn oxide.

This embodiment can be implemented in an appropriate combination with any of the structures described in the other embodiments.

(Embodiment 3)

In an imaging device of one embodiment of the present invention, an oxide as typified by an In—Ga—Zn oxide is used for the hole injection blocking layer included in the photoelectric conversion element. In this embodiment, the oxide will be described. Note that the oxide can be used as a semiconductor also for a transistor which is connected to the photoelectric conversion element; thus, its effective properties when the oxide is used for a transistor will also be described.

<Structure of Oxide>

A structure of the oxide is described below.

An oxide is classified into a single crystal oxide and the other, a non-single-crystal oxide. Examples of the non-single-crystal oxide include an oxide having a c-axis-aligned crystalline (CAAC) structure, a polycrystalline oxide, an oxide having a nanocrystalline (nc) structure, an amorphous-like (a-like) oxide, and an amorphous oxide.

From another perspective, an oxide is classified into an amorphous oxide and the other, a crystalline oxide. Examples of the crystalline oxide include a single crystal oxide, an oxide having a CAAC structure, a polycrystalline oxide, and an oxide having an nc structure.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide that is not isotropic (e.g., an oxide that has a periodic structure in a microscopic region) cannot be regarded as a completely amorphous oxide semiconductor. In contrast, an a-like structure, which is not isotropic, has an unstable structure that contains a void. Because of its instability, an a-like structure is close to an amorphous oxide in terms of physical properties.

<CAAC Structure>

First, an oxide having a CAAC structure will be described.

A CAAC structure is one of oxide structures having a plurality of c-axis-aligned crystal parts (also referred to as pellets).

Figure 15A:
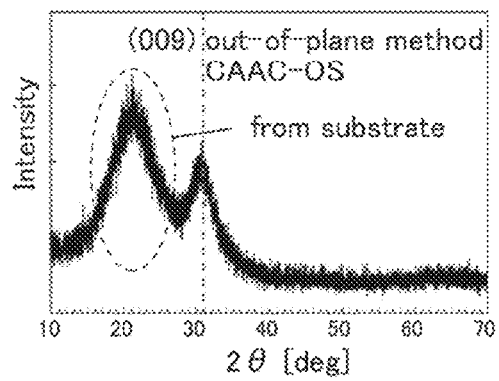
FIGS. 15A to 15E show structural analysis of an oxide having a CAAC structure and a single crystal oxide by XRD and selected-area electron diffraction patterns of an oxide having a CAAC structure.

Analysis of an oxide having a CAAC structure by X-ray diffraction (XRD) will be described. For example, when the oxide having a CAAC structure including an $InGaZnO_4$ crystal that is classified into the space group R-3m is analyzed by an out-of-plane method, a peak appears at a diffraction angle (2θ) of around 31° as shown in FIG. 15A. This peak is derived from the (009) plane of the InGaZnO$_4$ crystal, which indicates that crystals in the oxide having a CAAC structure have c-axis alignment, and that the c-axes are aligned in a direction substantially perpendicular to a surface over which a film of the oxide having a CAAC structure is formed (also referred to as a formation surface) or the top surface. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in an oxide having a CAAC structure.

Figure 15B:
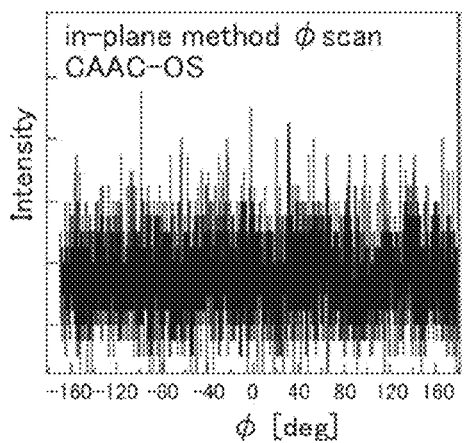
Figure 15C:
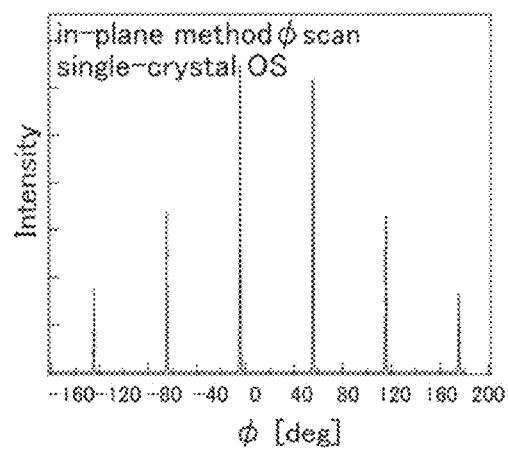

On the other hand, when the structure of the oxide having a CAAC structure is analyzed by an in-plane method in which an X-ray is incident on the oxide having a CAAC structure in the direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), a peak is not clearly observed as shown in FIG. 15B. In contrast, in the case where single crystal InGaZnO$_4$ is subjected to φ scan with 2θ fixed at around 56°, six peaks which are derived from crystal planes equivalent to the (110) plane are observed as shown in FIG. 15C. Accordingly, the structural analysis using XRD shows that the directions of a-axes and b-axes are irregularly oriented in the oxide having a CAAC structure.

Figure 15D:
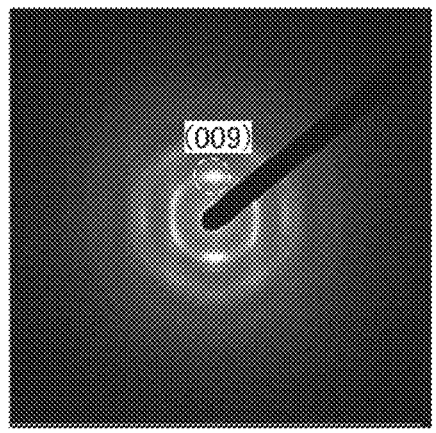
Figure 15E:
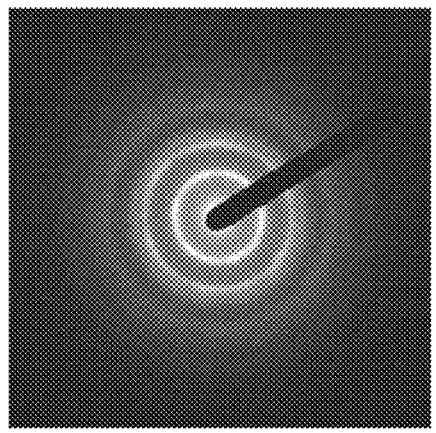

Next, an oxide having a CAAC structure analyzed by electron diffraction will be described. For example, when an electron beam with a probe diameter of 300 nm is incident on an oxide having a CAAC structure including an InGaZnO$_4$ crystal in the direction parallel to the formation surface of the oxide having a CAAC structure, such a diffraction pattern (also referred to as a selected-area electron diffraction pattern) as is shown in FIG. 15D can be obtained. In this diffraction pattern, spots derived from the (009) plane of an InGaZnO$_4$ crystal are included. Thus, the electron diffraction also indicates that pellets included in the oxide having a CAAC structure have c-axis alignment and that the c-axes are aligned in the direction substantially perpendicular to the formation surface or the top surface of the oxide having a CAAC structure. Meanwhile, FIG. 15E shows a diffraction pattern obtained in such a manner that an electron beam with a probe diameter of 300 nm is incident on the same sample in the direction perpendicular to the sample surface. As shown in FIG. 15E, a ring-like diffraction pattern is observed. Thus, the electron diffraction using an electron beam with a probe diameter of 300 nm also indicates that the a-axes and b-axes of the pellets included in the oxide having a CAAC structure do not have regular alignment. The first ring in FIG. 15E is considered to be derived from the (010) plane, the (100) plane, and the like of the InGaZnO$_4$ crystal. The second ring in FIG. 15E is considered to be derived from the (110) plane and the like.

In a combined analysis image (also referred to as a high-resolution TEM image) of a bright-field image and a diffraction pattern of an oxide having a CAAC structure, which is obtained using a transmission electron microscope (TEM), a plurality of pellets can be observed. However, even in the high-resolution TEM image, a boundary between pellets, that is, a grain boundary is not clearly observed in some cases. Thus, a reduction in electron mobility due to the grain boundary is less likely to occur when the oxide is used as a semiconductor.

Figure 16A:
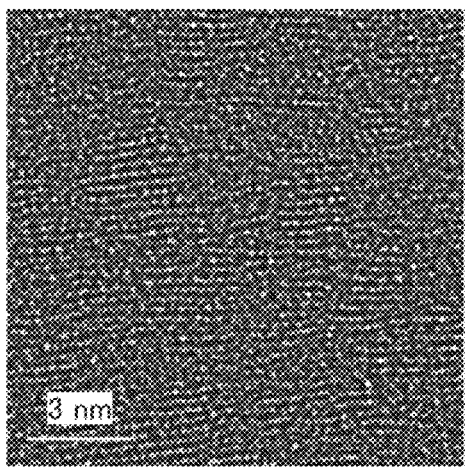
FIGS. 16A to 16E show a cross-sectional TEM image and plan-view TEM images of an oxide having a CAAC structure and images obtained through analysis thereof.

FIG. 16A shows a high-resolution TEM image of a cross section of the oxide having a CAAC structure observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 16A shows pellets in which metal atoms are arranged in a layered manner. FIG. 16A proves that the size of a pellet is greater than or equal to 1 nm or greater than or equal to 3 nm. Therefore, the pellet can also be referred to as a nanocrystal (nc). Furthermore, an oxide having a CAAC structure can also be referred to as an oxide including c-axis-aligned nanocrystals (CANC). A pellet reflects unevenness of a formation surface or a top surface of the oxide film, and is parallel to the formation surface or the top surface of the oxide film.

Figure 16B:
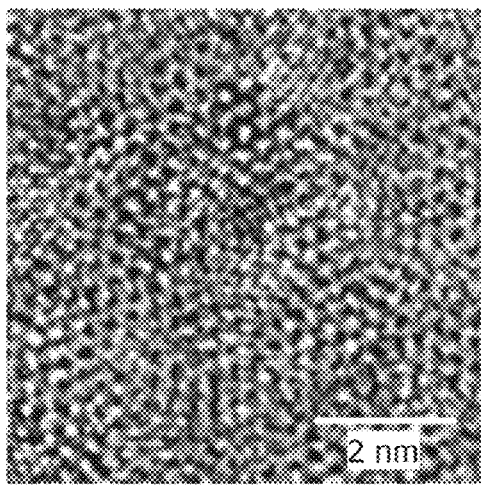
Figure 16C:
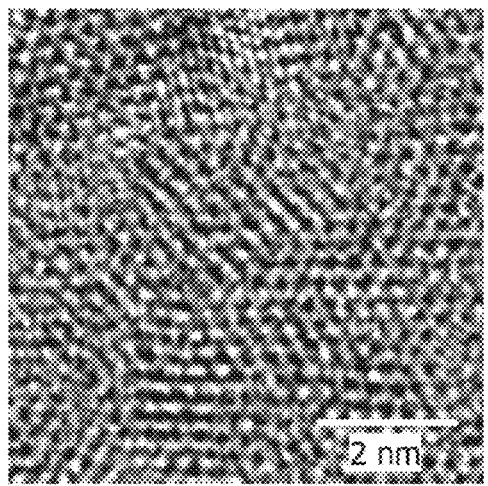
Figure 16D:
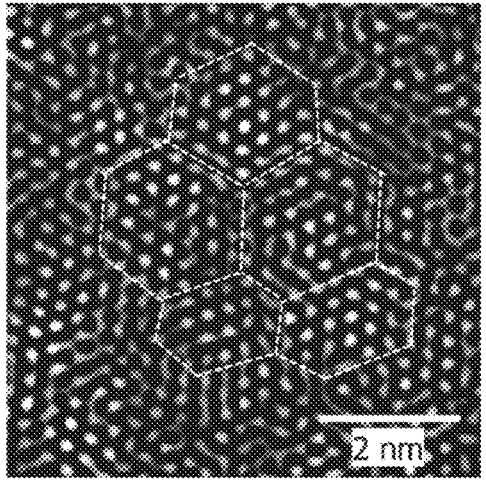
Figure 16E:
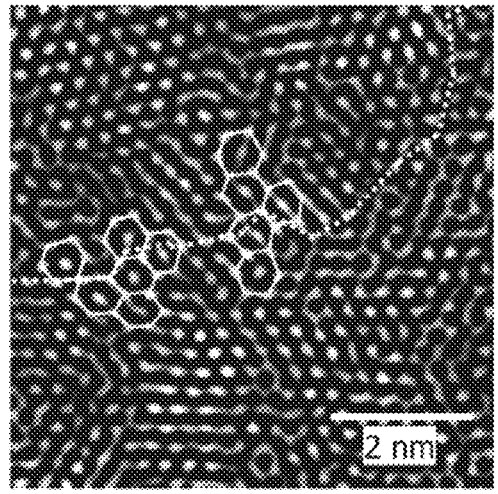

FIGS. 16B and 16C show Cs-corrected high-resolution TEM images of a plane of the oxide having a CAAC structure observed from a direction substantially perpendicular to the sample surface. FIGS. 16D and 16E are images obtained through image processing of FIGS. 16B and 16C. The method of image processing is as follows. The image in FIG. 16B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 16D, a portion where a lattice arrangement is broken is shown by dashed lines. A region surrounded by a dashed line is one pellet. The portion denoted by the dashed lines is a junction of pellets. The dashed line draws a hexagon, which means that the pellet has a hexagonal shape. Note that the shape of the pellet is not always a regular hexagon but is a non-regular hexagon in many cases.

In FIG. 16E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the oxide having a CAAC structure can tolerate distortion owing to a low density of interatomic bond distance in the a-b plane direction, an interatomic bond distance changed by substitution of a metal element, and the like.

As described above, the oxide having a CAAC structure has c-axis alignment, its pellets (nanocrystals) are connected in the a-b plane direction, and the crystal structure has distortion. For this reason, the oxide having a CAAC structure can also be referred to as an oxide including a c-axis-aligned a-b-plane-anchored (CAA) crystal.

The CAAC structure is a highly crystalline structure. Entry of impurities, formation of defects, or the like might decrease the crystallinity of an oxide. This means that the oxide having a CAAC structure has negligible amounts of impurities and defects (e.g., oxygen vacancies).

Note that, in the case where the oxide is used as a semiconductor, the impurity means an element other than the main components of the oxide, for example, hydrogen, carbon, silicon, and a transition metal element. For example, an element (specifically, silicon or the like) having higher strength of bonding to oxygen than a metal element included in an oxide extracts oxygen from the oxide, which results in disorder of the atomic arrangement and reduced crystallinity of the oxide. A heavy metal such as iron or nickel, argon, carbon dioxide, or the like has a large atomic radius (or molecular radius), and thus disturbs the atomic arrangement of the oxide and decreases crystallinity.

The characteristics of an oxide having impurities or defects which is used as a semiconductor might be changed by light, heat, or the like. For example, the impurity contained in the oxide might serve as a carrier trap or serve as a carrier generation source. For example, oxygen vacancies in the oxide might serve as carrier traps or serve as carrier generation sources when hydrogen is captured therein.

The oxide having a CAAC structure having small amounts of impurities and oxygen vacancies which is used as a semiconductor is an oxide semiconductor with low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. A CAAC oxide semiconductor (OS) has a low impurity concentration and a low density of defect states. Thus, the CAAC-OS can be referred to as an oxide semiconductor having stable characteristics.

<nc Structure>

An oxide having an nc structure will be described below.

Analysis of an oxide having an nc structure by XRD will be described. When the structure of an oxide having an nc structure is analyzed by an out-of-plane method, for example, a peak indicating orientation does not appear. That is, a crystal of an oxide having an nc structure does not have orientation.

Figure 17A:
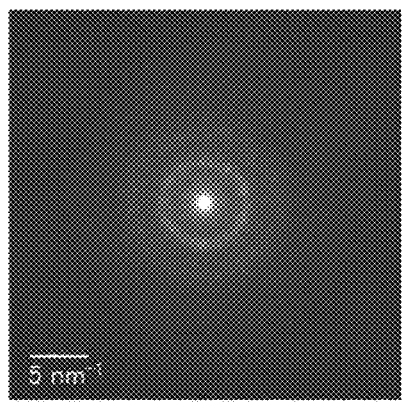
FIGS. 17A to 17D show electron diffraction patterns and a cross-sectional TEM image of an oxide having an nc structure.
Figure 17B:
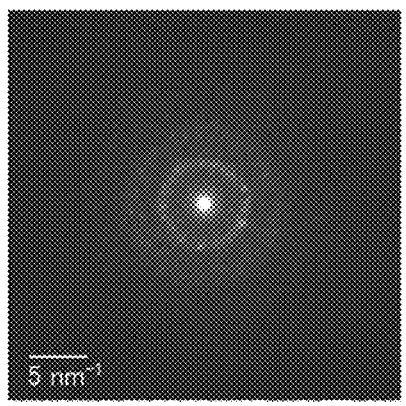

For example, when an electron beam with a probe diameter of 50 nm is incident on a 34-nm-thick region of thinned oxide having an nc structure including an $InGaZnO_4$ crystal in the direction parallel to the formation surface, a ring-shaped diffraction pattern (a nanobeam electron diffraction pattern) shown in FIG. 17A is observed. FIG. 17B shows a diffraction pattern obtained when an electron beam with a probe diameter of 1 nm is incident on the same sample. As shown in FIG. 17B, a plurality of spots are observed in a ring-like region. In other words, ordering in an oxide having an nc structure is not observed with an electron beam with a probe diameter of 50 nm but is observed with an electron beam with a probe diameter of 1 nm.

Figure 17C:
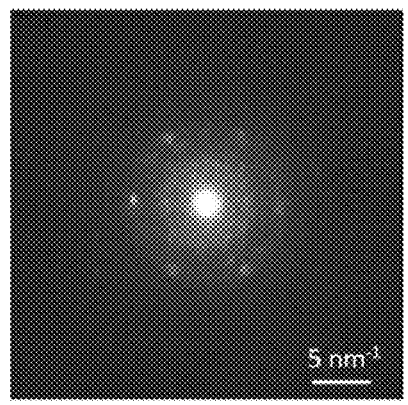

Furthermore, an electron diffraction pattern in which spots are arranged in an approximately hexagonal shape is observed in some cases as shown in FIG. 17C when an electron beam having a probe diameter of 1 nm is incident on a region with a thickness of less than 10 nm. This means that an oxide having an nc structure has a well-ordered region, i.e., a crystal, in the range of less than 10 nm in thickness. Note that an electron diffraction pattern having regularity is not observed in some regions because crystals are aligned in various directions.

Figure 17D:
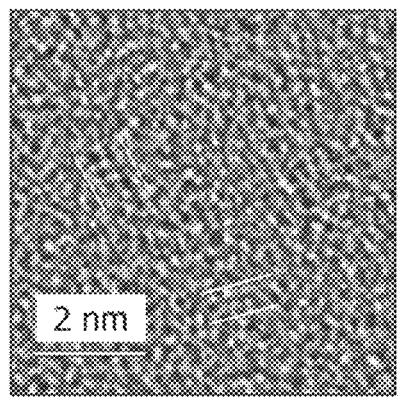

FIG. 17D shows a Cs-corrected high-resolution TEM image of a cross section of an oxide having an nc structure observed from the direction substantially parallel to the formation surface. In a high-resolution TEM image, the oxide has a region in which a crystal part is observed, such as the part indicated by additional lines in FIG. 17D, and a region in which a crystal part is not clearly observed. In most cases, the size of a crystal part included in the oxide is greater than or equal to 1 nm and less than or equal to 10 nm, in particular, greater than or equal to 1 nm and less than or equal to 3 nm. An oxide including a crystal part whose size is greater than 10 nm and less than or equal to 100 nm can be referred to as a microcrystalline oxide. In a high-resolution TEM image of the oxide having an nc structure, for example, a grain boundary is not clearly observed in some cases. Note that there is a possibility that the origin of the nanocrystal is the same as that of a pellet in an oxide having a CAAC structure. Therefore, a crystal part of the oxide having an nc structure may be referred to as a pellet in the following description.

As described above, in the oxide having an nc structure, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the oxide having an nc structure. Thus, the orientation of the whole film is not ordered. Accordingly, the oxide having an nc structure cannot be distinguished from an oxide having an a-like structure or an amorphous oxide, depending on analysis methods.

Since there is no regularity of crystal orientation between the pellets (nanocrystals), the oxide having an nc structure can also be referred to as an oxide including random aligned nanocrystals (RANC) or an oxide including non-aligned nanocrystals (NANC).

The oxide having an nc structure is an oxide that has high regularity as compared with an amorphous oxide. Therefore, the oxide having an nc structure is likely to have a lower density of defect states than an oxide having an a-like structure and an amorphous oxide. Note that there is no regularity of crystal orientation between different pellets in the oxide having an nc structure. Therefore, the oxide having an nc structure has a higher density of defect states than the oxide having a CAAC structure.

<Oxide Having a-Like Structure>

An oxide having an a-like structure has a structure between those of the oxide having an nc structure and the amorphous oxide.

FIGS. 18A and 18B are high-resolution cross-sectional TEM images of an oxide having an a-like structure. FIG. 18A is the high-resolution cross-sectional TEM image of the oxide having an a-like structure at the start of the electron irradiation. FIG. 18B is the high-resolution cross-sectional TEM image of the oxide having an a-like structure after the electron ($e^-$) irradiation at $4.3\times10^8$ $e^-/nm^2$. FIGS. 18A and 18B show that stripe-like bright regions extending vertically are observed in the oxide having an a-like structure from the start of the electron irradiation. It can also be found that the shape of the bright region changes after the electron irradiation. Note that the bright region is presumably a void or a low-density region.

The oxide having an a-like structure has an unstable structure because it contains a void. To verify that an oxide having an a-like structure has an unstable structure as compared with an oxide having a CAAC structure and an oxide having an nc structure, a change in structure caused by electron irradiation will be described below.

An oxide having an a-like structure, an oxide having an nc structure, and an oxide having a CAAC structure are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing of (009) plane (also referred to as d value). The value is calculated to be 0.29 nm from crystal structural analysis. Accordingly, a portion where the distance between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 19:
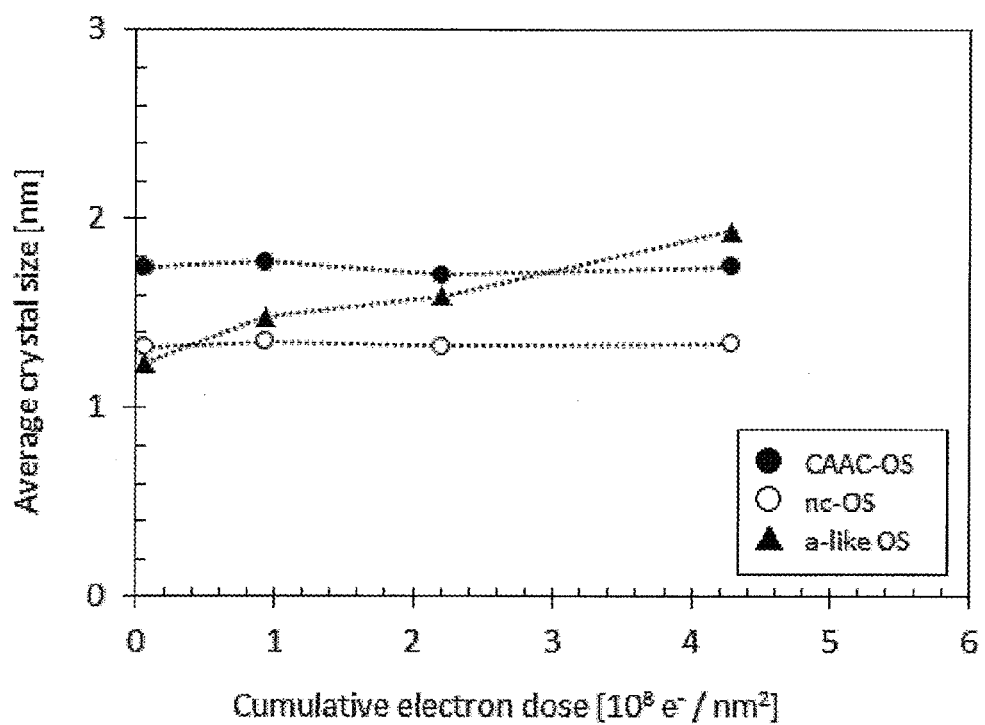
FIG. 19 shows a change in crystal part of an In—Ga—Zn oxide induced by electron irradiation.

FIG. 19 shows change in the average size of crystal parts (at 22 points to 30 points) in each sample. Note that the crystal part size corresponds to the length of a lattice fringe. FIG. 19 indicates that the crystal part size in the oxide having an a-like structure increases with an increase in the cumulative electron dose in obtaining TEM images, for example. As shown in FIG. 19, a crystal part of approximately 1.2 nm (also referred to as an initial nucleus) at the start of TEM observation grows to a size of approximately 1.9 nm at a cumulative electron (e$^-$) dose of 4.2×10$^8$ e$^-$/nm$^2$. In contrast, the crystal part size in the oxide having an nc structure and the oxide having a CAAC structure shows little change from the start of electron irradiation to a cumulative electron dose of 4.2×10$^8$ e/nm$^2$. As shown in FIG. 19, the size of crystal parts in an oxide having an nc structure and an oxide having a CAAC structure are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiations are as follows: the accelerating voltage is 300 kV; the current density is 6.7×10$^5$ e$^-$/(nm$^2$×s); and the diameter of irradiation region is 230 nm.

In this manner, growth of the crystal part in the oxide having an a-like structure is induced by electron irradiation. In contrast, in the oxide having an nc structure and the oxide having a CAAC structure, growth of the crystal part is hardly induced by electron irradiation. Therefore, the oxide having an a-like structure has an unstable structure as compared with the oxide having an nc structure and the oxide having a CAAC structure.

The oxide having an a-like structure has a lower density than the oxide having an nc structure and the oxide having a CAAC structure because it contains a void. Specifically, the density of the oxide having an a-like structure is higher than or equal to 78.6% and lower than 92.3% of the density of the single crystal oxide having the same composition. The density of each of the oxide having an nc structure and the oxide having a CAAC structure is higher than or equal to 92.3% and lower than 100% of the density of the single crystal oxide having the same composition. It is difficult to deposit an oxide having a density of lower than 78% of the density of the single crystal oxide.

For example, in the case of an oxide having an atomic ratio of In:Ga:Zn=1:1:1, the density of single crystal InGaZnO$_4$ with a rhombohedral crystal structure is 6.357 g/cm$^3$. Accordingly, in the case of the oxide having an atomic ratio of In:Ga:Zn=1:1:1, for example, the density of the oxide having an a-like structure is higher than or equal to 5.0 g/cm$^3$ and lower than 5.9 g/cm$^3$. For example, in the case of the oxide having an atomic ratio of In:Ga:Zn=1:1:1, the density of each of the oxide having an nc structure and the oxide having a CAAC structure is higher than or equal to 5.9 g/cm$^3$ and lower than 6.3 g/cm$^3$.

Note that in the case where an oxide having a certain composition does not exist in a single crystal structure, single crystal oxides with different compositions are combined at an adequate ratio, which makes it possible to calculate density equivalent to that of a single crystal oxide with the desired composition. The density of a single crystal oxide having the desired composition can be calculated using a weighted average according to the combination ratio of the single crystal oxide with different compositions. Note that it is preferable to use as few kinds of single crystal oxides as possible to calculate the density.

As described above, an oxide as typified by an In—Ga—Zn oxide has various structures and various properties. Note that an oxide may be a stack including two or more of an amorphous oxide, an a-like structure, an nc structure, and a CAAC structure, for example.

When a photoelectric conversion layer, which is a formation layer of the hole injection blocking layer, is a crystalline selenium layer, an oxide as typified by an In—Ga—Zn oxide is preferably used for a hole injection blocking layer because the interface between the both layers has a preferable property due to the similar crystallinity of the layers. In addition, when an oxide as typified by an In—Ga—Zn oxide is used for a hole injection blocking layer and an indium tin oxide film or an indium tin oxide film to which silicon is added is used for the second electrode formed thereover, they are well suited to each other because the both are oxide films containing indium and their compositions are close to each other. That is, adhesion between the hole injection blocking layer and the second electrode is improved and the interface has a preferable property.

The structure described in this embodiment can be used in appropriate combination with the structure described in any of the other embodiments.

(Embodiment 4)

An imaging device of one embodiment of the present invention and a semiconductor device including the imaging device can be used for display devices, personal computers, or image reproducing devices provided with recording media (typically, devices that reproduce the content of recording media such as digital versatile discs (DVD) and have displays for displaying the reproduced images). Furthermore, as electronic devices that can include the imaging device of one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 20A to 20F illustrate specific examples of these electronic devices.

Figure 20A:
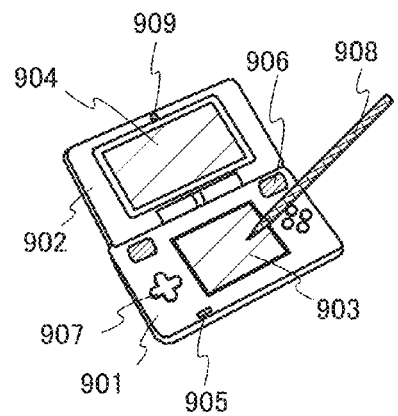
FIGS. 20A to 20F illustrate electronic devices.

FIG. 20A illustrates a portable game machine, which includes housings 901 and 902, display portions 903 and 904, a microphone 905, speakers 906, an operation key 907, a stylus 908, a camera 909, and the like. Although the portable game machine in FIG. 20A includes the two display portions 903 and 904, the number of display portions included in the portable game machine is not limited to this.

The imaging device of one embodiment of the present invention can be used for the camera 909.

Figure 20B:
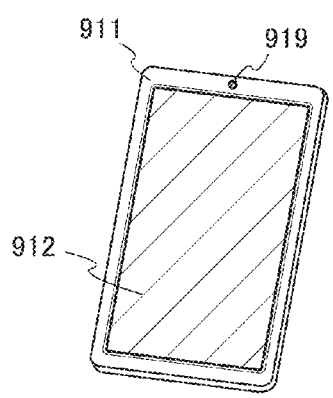

FIG. 20B illustrates a portable data terminal, which includes a first housing 911, a display portion 912, a camera 919, and the like. The touch panel function of the display portion 912 enables input and output of information. The imaging device of one embodiment of the present invention can be used for the camera 919.

Figure 20C:
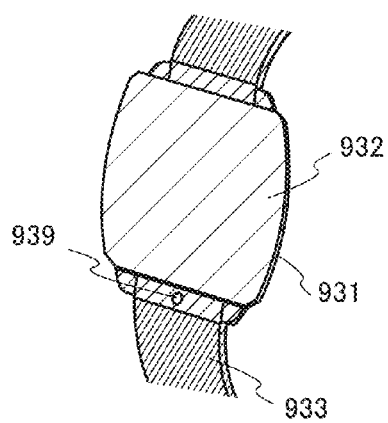

FIG. 20C illustrates a wrist-watch-type information terminal, which includes a housing 931, a display portion 932, a wristband 933, a camera 939, and the like. The display portion 932 may be a touch panel. The imaging device of one embodiment of the present invention can be used for the camera 939.

Figure 20D:
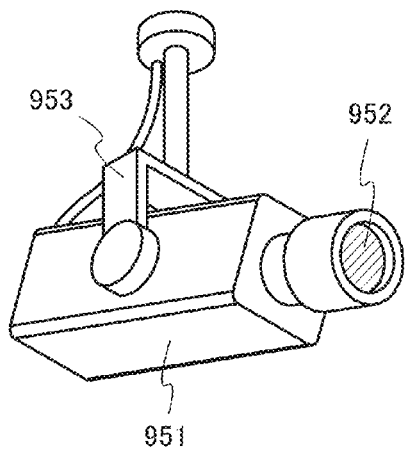

FIG. 20D illustrates a monitoring camera, which includes a housing 951, a lens 952, a support portion 953, and the like. The imaging device of one embodiment of the present invention can be provided in a focus position of the lens 952.

Figure 20E:
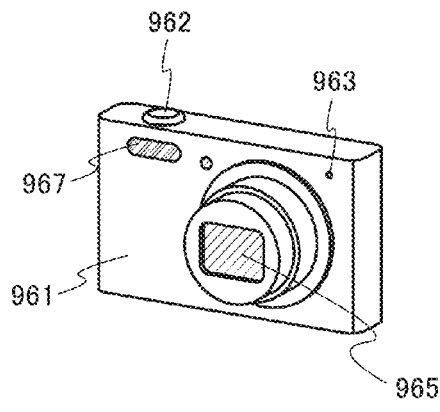

FIG. 20E illustrates a digital camera, which includes a housing 961, a shutter button 962, a microphone 963, a light-emitting portion 967, a lens 965, and the like. The imaging device of one embodiment of the present invention can be provided in a focus position of the lens 965.

Figure 20F:
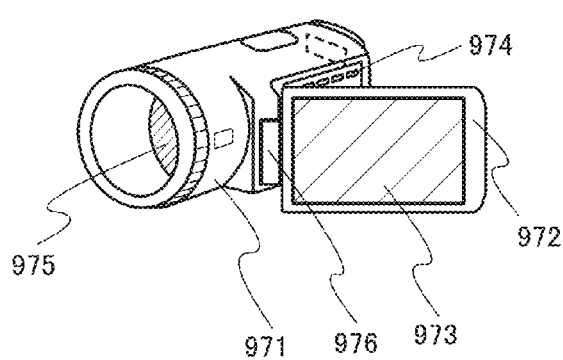

FIG. 20F illustrates a video camera, which includes a first housing 971, a second housing 972, a display portion 973, operation keys 974, a lens 975, a joint 976, and the like. The operation keys 974 and the lens 975 are provided in the first housing 971, and the display portion 973 is provided in the second housing 972. The first housing 971 and the second housing 972 are connected to each other with the joint 976, and an angle between the first housing 971 and the second housing 972 can be changed with the joint 976. An image displayed on the display portion 973 may be switched in accordance with the angle between the first housing 971 and the second housing 972 at the joint 976. The imaging device of one embodiment of the present invention can be provided in a focus of the lens 975.

This embodiment can be combined with any of the other embodiments in this specification as appropriate.

EXAMPLE 1

In this example, the measurement results of resistivity of the oxide layer subjected to ion addition treatment will be described.

Figure 23:
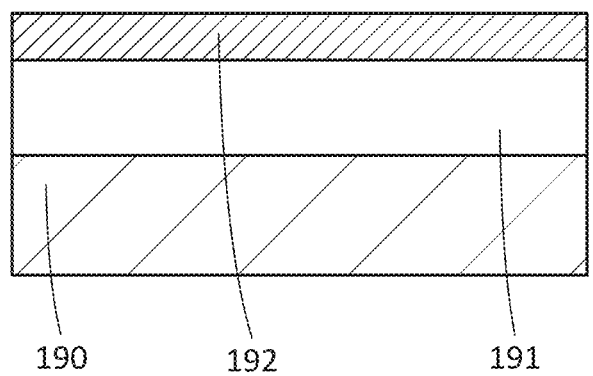
FIG. 23 illustrates a structure of a measurement sample.

A measurement sample with a structure shown in FIG. 23 was formed. The measurement sample was formed in the following manner. Note that the method of forming the sample is not limited to the manner described below.

A Si wafer of approximately 700 μm in thickness was used as a substrate 190.

As an insulating layer 191, a stacked layer including a silicon oxide film and a silicon oxynitride film was formed over the substrate 190.

The silicon oxide film was formed in such a manner that the Si wafer was thermally oxidized to a depth of approximately 100 nm by a thermal oxidation method performed at 950° C. with the use of hydrochloric acid.

The silicon oxynitride film was deposited to 300 nm by a plasma CVD method. The deposition conditions were as follows: the gas flow rates of silane and dinitrogen monoxide were 2.3 sccm and 800 sccm, respectively; the deposition pressure in a chamber was controlled to be 40 Pa using a diaphragm-type baratron sensor and an APC valve; the RF power frequency was 27 MHz; the deposition power was 50 W; the distance between electrodes was 15 mm; and the substrate heating temperature was 400° C.

Next, as an oxide layer 192, a 50-nm-thick In—Ga—Zn oxide film was formed by a sputtering method using an oxide having an atomic ratio of In:Ga:Zn is 1:1:1 as a target. In addition, a sample including a 50-nm-thick In—Ga—Zn oxide film formed using an oxide having an atomic ratio of In:Ga:Zn is 4:2:4.1 as a target was also formed. The deposition conditions were as follows: the pressure in a chamber was 0.7 Pa; a DC power source was used and the power was 0.5 kW; the sputtering gas flow rates of an Ar gas and an oxygen gas were 30 sccm and 15 sccm, respectively; the distance between the sample and the target was 60 mm; and the substrate heating temperature was 300° C.

After the oxide layer 192 was formed, heat treatment was performed at 450° C. in a nitrogen atmosphere for one hour, and then, heat treatment was performed at 450° C. in an oxygen atmosphere for one hour.

The ion addition treatment was performed by an ion implantation method.

Table 1 shows the ion implantation conditions and measured sheet resistances of the samples formed using an oxide having an atomic ratio of In:Ga:Zn=1:1:1 as a target. In addition, the measurement results of samples which were not subjected to the ion addition treatment are also shown as comparative examples. Table 2 shows the ion implantation conditions and measured sheet resistances of the samples formed using an oxide having an atomic ratio of In:Ga:Zn=4:2:4.1 as a target. In addition, the measurement results of samples which were not subjected to the ion addition treatment are also shown as comparative examples.

TABLE 1

| Atomic ratio of target | Added atomic species | Accereleration voltage | Dose (ions/cm$^2$) | Sheet resistance (Ω/□) |
|---|---|---|---|---|
| In:Ga:Zn = 1:1:1 | Phosphorous (P) | No | No | Over range |
| | | 20 kV | 5.0E+13 | 2.8E+04 |
| | | | 3.0E+14 | 4.8E+03 |
| | | | 1.0E+15 | 1.0E+04 |
| | | | 5.0E+15 | 2.1E+04 |
| | Helium (He) | No | No | Over range |
| | | 5 kV | 1.0E+13 | Over range |
| | | | 1.0E+14 | Over range |
| | | | 1.0E+15 | 1.3E+06 |
| | | | 1.0E+16 | 5.9E+04 |
| | Argon (Ar) | No | No | Over range |
| | | 20 kV | 5.0E+13 | 2.9E+05 |
| | | | 3.0E+14 | 9.0E+03 |
| | | | 1.0E+15 | 6.9E+03 |
| | | | 5.0E+15 | 1.1E+04 |
| | Xenon (Xe) | No | No | Over range |
| | | 50 kV | 5.0E+13 | 9.4E+03 |
| | | | 3.0E+14 | 4.6E+03 |
| | | | 1.0E+15 | 5.9E+03 |
| | | | 5.0E+15 | 1.0E+04 |

TABLE 2

| Atomic ratio of target | Added atomic species | Accereleration voltage | Dose (ions/cm$^2$) | Sheet resistance (Ω/□) |
|---|---|---|---|---|
| In:Ga:Zn = 4:2:4.1 | Phosphorous (P) | No | No | Over range |
| | | 20 kV | 5.0E+13 | 3.4E+03 |
| | | | 3.0E+14 | 8.2E+02 |
| | | | 1.0E+15 | 1.4E+03 |
| | | | 5.0E+15 | 3.4E+03 |
| | Helium (He) | No | No | Over range |
| | | 5 kV | 1.0E+13 | Over range |
| | | | 1.0E+14 | 3.0E+06 |
| | | | 1.0E+15 | 3.8E+04 |

TABLE 2-continued

| Atomic ratio of target | Added atomic species | Accerelation voltage | Dose (ions/cm²) | Sheet resistance (Ω/□) |
|---|---|---|---|---|
| | | | 1.0E+16 | 3.4E+03 |
| | Argon (Ar) | No | No | Over range |
| | | 20 kV | 5.0E+13 | 1.3E+04 |
| | | | 3.0E+14 | 1.3E+03 |
| | | | 1.0E+15 | 9.7E+02 |
| | | | 5.0E+15 | 1.3E+03 |
| | Xenon (Xe) | No | No | Over range |
| | | 50 kV | 5.0E+13 | 1.4E+03 |
| | | | 3.0E+14 | 7.8E+02 |
| | | | 1.0E+15 | 8.8E+02 |
| | | | 5.0E+15 | 1.5E+03 |

Note that the resistances of the samples were measured with a sheet resistance processor Σ-10 fabricated by NPS, INC.

As shown in Tables 1 and 2, it was found that the resistivity of the samples subjected to the ion implantation treatment was able to be reduced stably as compared with the samples which were not subjected to the ion implantation treatment, and it can be said to all the ion species of phosphorus, helium, argon, and xenon.

EXAMPLE 2

In this example, the In—Ga—Zn oxide film was subjected to treatment for increasing its electrical conductivity, and change in its light transmittance was observed. In addition, a gallium oxide film was also subjected to treatment for increasing its electrical conductivity, and change in its light transmittance was observed for comparison.

Figure 24A:
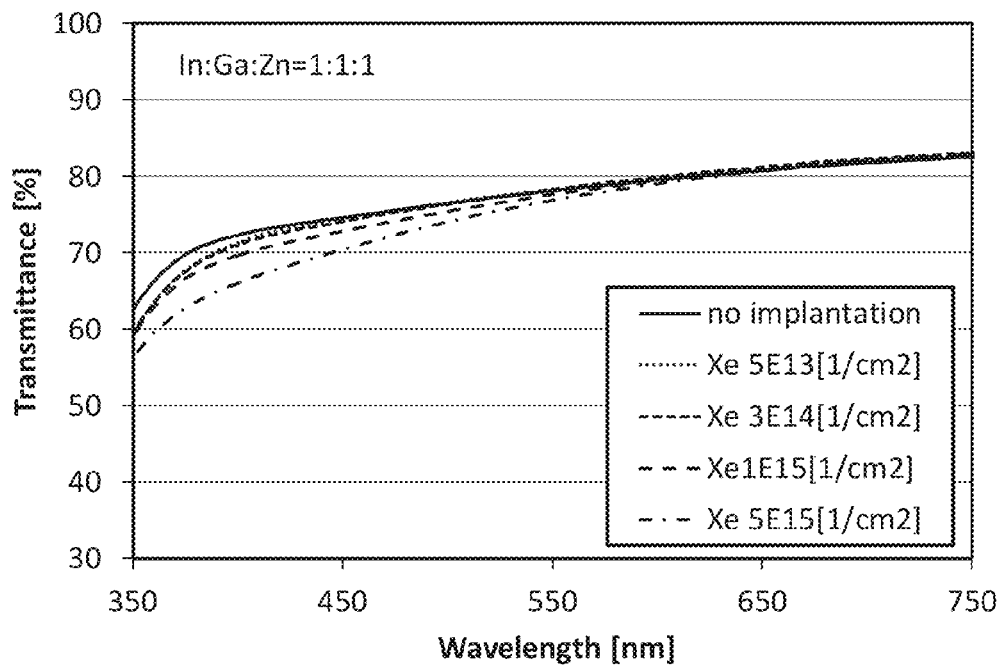
FIGS. 24A and 24B each show light transmittance of an In—Ga—Zn oxide film.
Figure 24B:
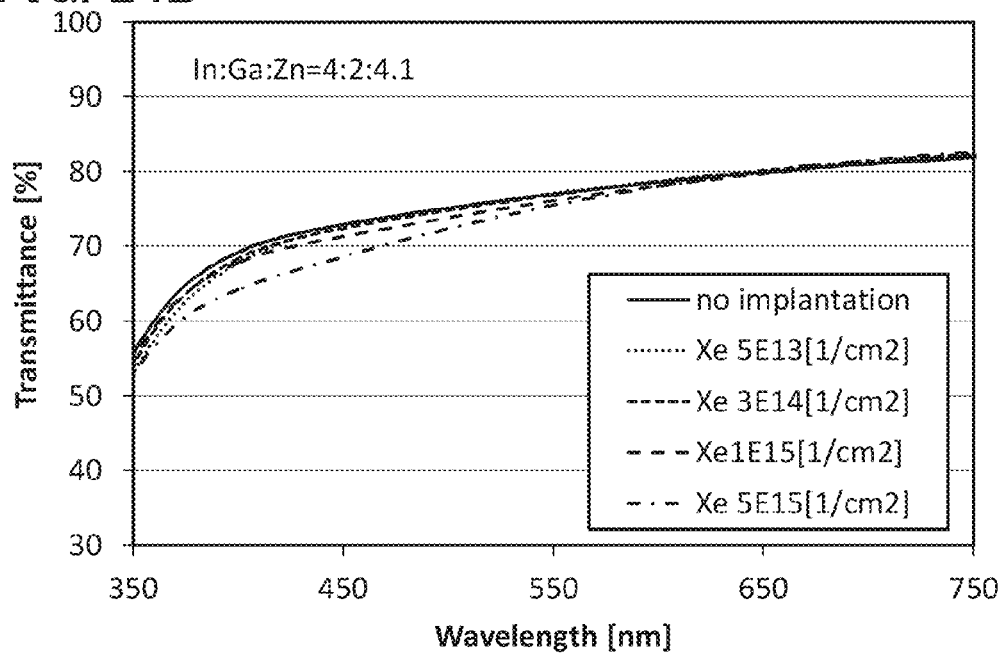

First, the sample that was used in Example 1 was used for the In—Ga—Zn oxide film. That is, a 50-nm-thick In—Ga—Zn oxide film which was formed by a sputtering method using an oxide having an atomic ratio of In:Ga:Zn=1:1:1 as a target was used. In addition, a 50-nm-thick In—Ga—Zn oxide film which was formed using an oxide having an atomic ratio of In:Ga:Zn=4:2:4.1 as a target was used. Implantation of Xe was performed according to a plurality of conditions to increase the electrical conductivity, and then, the light transmittance was measured. The results are shown in FIGS. 24A and 24B.

Figure 25:
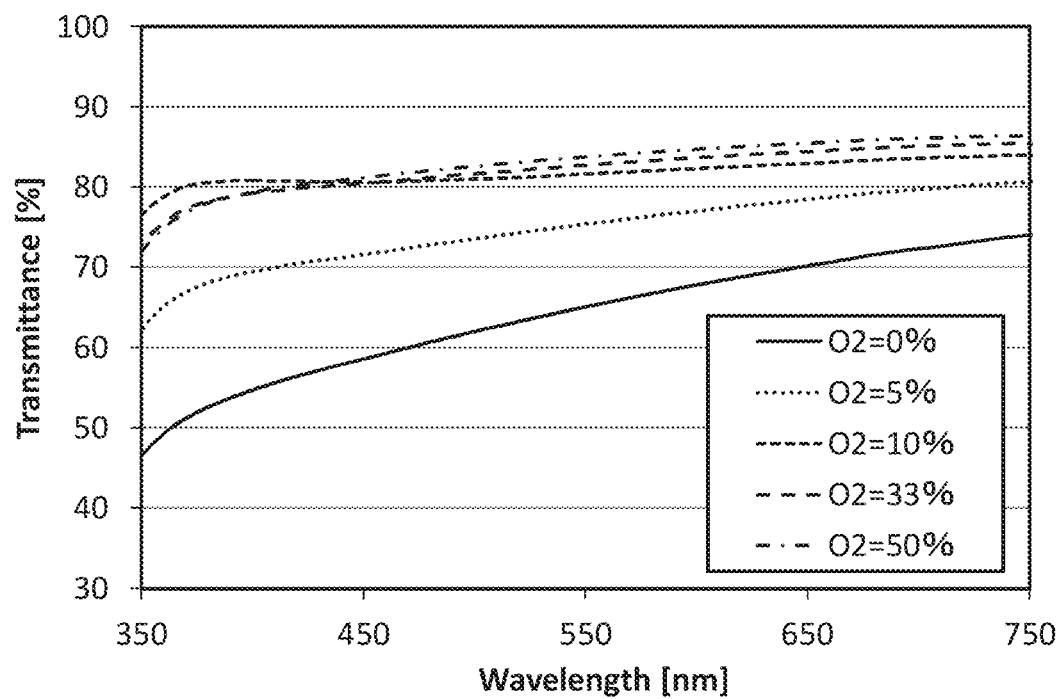
FIG. 25 shows light transmittance of a gallium oxide film.

As the gallium oxide film, a 50-nm-thick film was formed by a sputtering method using a sintered $Ga_2O_3$ target. A partial pressure of oxygen in a deposition process gas (i.e., a mixed gas of argon and oxygen) was changed according to a plurality of conditions, and then, the light transmittance of the obtained film was measured. The results are shown in FIG. 25.

Table 3 shows electrical conductivities of the samples.

TABLE 3

| Films | Film thickness (nm) | Dose (ions/cm²) | Oxygen flow rate (%) | Conductivity (S/cm) |
|---|---|---|---|---|
| IGZO (In:Ga:Zn = 1:1:1) | 50 nm | No | | Detection limit |
| | | 5.00E+13 | | 2.1E+01 |
| | | 3.00E+14 | | 4.4E+01 |
| | | 1.00E+15 | | 3.4E+01 |
| | | 5.00E+15 | | 2.0E+01 |
| IGZO (In:Ga:Zn = 4:2:4.1) | | No | | Detection limit |
| | | 5.00E+13 | | 1.5E+02 |
| | | 3.00E+14 | | 2.6E+02 |
| | | 1.00E+15 | | 2.3E+02 |
| | | 5.00E+15 | | 1.4E+02 |
| GaOx | | | 0 | 1.1E−06 |
| | | | 5 | 4.0E−07 |
| | | | 10 | 3.9E−07 |
| | | | 33 | 3.3E−09 |
| | | | 50 | 1.6E−09 |

FIGS. 24A and 24B, FIG. 25, and Table 3 indicate that the light transmittance of the In—Ga—Zn oxide film is less likely to decrease through the treatment for increasing the electrical conductivity of the films as compared with that of the gallium oxide film. It is also indicated that the electrical conductivity of the In—Ga—Zn oxide film can be improved as compared with that of the gallium oxide film. Accordingly, as a material for the hole injection blocking layer included in the photoelectric conversion element, the In—Ga—Zn oxide film is preferable to the gallium oxide film in order to form a layer in which an electrical conductivity is partly improved and make the hole injection blocking layer thinner.

This application is based on Japanese Patent Application serial No. 2015-131426 filed with Japan Patent Office on Jun. 30, 2015, the entire contents of which are hereby incorporated by reference.

What is claimed is:

1. A photoelectric conversion element comprising:
   a first electrode;
   a first layer;
   a second layer; and
   a third layer,
   wherein the first layer is positioned between the first electrode and the third layer,
   wherein the second layer is positioned between the first layer and the third layer,
   wherein the first layer comprises selenium,
   wherein the second layer comprises a metal oxide,
   wherein the third layer comprises a metal oxide,
   wherein the metal oxide of the second layer comprises In, Ga, and Zn, and
   wherein the metal oxide of the third layer comprises In, Ga, and Zn.

2. The photoelectric conversion element according to claim 1, wherein the second layer comprises c-axis-aligned crystals.

3. The photoelectric conversion element according to claim 1, wherein the selenium is crystalline selenium.

4. The photoelectric conversion element according to claim 1,
   wherein the first layer serves as a photoelectric conversion layer, and
   wherein the second layer serves as a hole injection blocking layer.

5. The photoelectric conversion element according to claim 1, further comprising a fourth layer positioned between the first layer and the first electrode, wherein the fourth layer serves as an electron injection blocking layer.

6. The photoelectric conversion element according to claim 5, wherein the fourth layer comprises nickel oxide or antimony sulfide.

7. The photoelectric conversion element according to claim 1, further comprising a second electrode in contact with the third layer, wherein the second electrode comprises indium tin oxide.

8. An imaging device comprising:
the photoelectric conversion element according to claim 1; and
a driver transistor,
wherein the driver transistor is electrically connected to the photoelectric conversion element.

9. The imaging device according to claim 8, further comprising:
a microlens array or a diffraction grating; and
a color filter,
wherein the photoelectric conversion element is capable of receiving light passing through the microlens array or the diffraction grating and the color filter.

10. The imaging device according to claim 8, wherein the driver transistor comprises an oxide semiconductor.

11. The imaging device according to claim 8, comprising the photoelectric conversion elements, wherein a number of the photoelectric conversion elements is larger than or equal to a number enabling production of video signals with 8K resolution.

12. The photoelectric conversion element according to claim 1, wherein the third layer has an electrical conductivity of greater than or equal to $2.0 \times 10^1$ S/cm and less than or equal to $2.6 \times 10^2$ S/cm.

13. A photoelectric conversion element comprising:
a first electrode;
a first layer;
a second layer; and
a third layer,
wherein the first layer is positioned between the first electrode and the third layer,
wherein the second layer is positioned between the first layer and the third layer,
wherein the first layer comprises selenium,
wherein the second layer comprises a metal oxide,
wherein the third layer comprises a metal oxide and also comprises at least one of a rare gas atom, phosphorus, and boron,
wherein the metal oxide of the second layer comprises In, Ga, and Zn, and
wherein the metal oxide of the third layer comprises In, Ga, and Zn.

14. An imaging device comprising:
the photoelectric conversion element according to claim 13; and
a driver transistor,
wherein the driver transistor is electrically connected to the photoelectric conversion element.

15. The imaging device according to claim 14, further comprising:
a microlens array or a diffraction grating; and
a color filter,
wherein the photoelectric conversion element is capable of receiving light passing through the microlens array or the diffraction grating and the color filter.

16. The imaging device according to claim 14, wherein the driver transistor comprises an oxide semiconductor.

17. The imaging device according to claim 14, comprising the photoelectric conversion elements, wherein a number of the photoelectric conversion elements is larger than or equal to a number enabling production of video signals with 8K resolution.

18. A photoelectric conversion element comprising:
a first electrode;
a first layer over the first electrode;
a second layer over the first layer; and
a third layer over the second layer,
wherein the first layer comprises crystalline selenium,
wherein the first layer serves as a photoelectric conversion layer,
wherein the second layer comprises an In—Ga—Zn oxide comprising c-axis-aligned crystals,
wherein the third layer comprises an In—Ga—Zn oxide comprising c-axis-aligned crystals,
wherein the third layer further comprises at least one of xenon and phosphorus,
wherein the second layer serves as a hole injection blocking layer, and
wherein the third layer serves as an electrode.

19. An imaging device comprising:
the photoelectric conversion element according to claim 18; and
a driver transistor,
wherein the driver transistor is electrically connected to the photoelectric conversion element.

20. The imaging device according to claim 19, further comprising:
a microlens array or a diffraction grating; and
a color filter,
wherein the photoelectric conversion element is capable of receiving light passing through the microlens array or the diffraction grating and the color filter.

21. The imaging device according to claim 19, wherein the driver transistor comprises an oxide semiconductor.

22. The imaging device according to claim 19, comprising the photoelectric conversion elements, wherein a number of the photoelectric conversion elements is larger than or equal to a number enabling production of video signals with 8K resolution.

* * * * *